US006674908B1

(12) United States Patent
Aronov

(10) Patent No.: US 6,674,908 B1
(45) Date of Patent: Jan. 6, 2004

(54) METHOD OF COMPRESSION OF BINARY DATA WITH A RANDOM NUMBER GENERATOR

(76) Inventor: Edward Lasar Aronov, 2528 Cruger Ave. Apt. 4C, Bronx, NY (US) 10467

( * ) Notice: Subject to any disclaimer, the term of this patent is extended or adjusted under 35 U.S.C. 154(b) by 0 days.

(21) Appl. No.: 10/243,196

(22) Filed: Sep. 13, 2002

Related U.S. Application Data

(60) Provisional application No. 60/377,683, filed on May 4, 2002.

(51) Int. Cl.[7] .................................................. G06K 9/36
(52) U.S. Cl. ......................... 382/232; 382/244; 382/248
(58) Field of Search ................................ 382/232, 239, 382/244, 245, 246, 247, 248, 249; 341/51, 52, 61, 62

(56) References Cited

U.S. PATENT DOCUMENTS

| | | | |
|---|---|---|---|
| 5,406,279 A | 4/1995 | Anderson | 341/51 |
| 5,533,051 A | 7/1996 | James | 375/240 |
| 5,977,889 A | 11/1999 | Cohen | 341/55 |
| 6,075,470 A | 6/2000 | Little | 341/107 |
| 6,088,699 A | 7/2000 | Gampper | 707/10 |
| 6,122,379 A | 9/2000 | Barbir | 380/269 |
| 6,141,445 A | 10/2000 | Castelli | 382/232 |
| 6,172,624 B1 | 1/2001 | Cooper | 341/63 |
| 6,333,705 B1 | 12/2001 | Amonou | 341/107 |
| 6,351,539 B1 | 2/2002 | Djakovic | 380/268 |
| 6,411,714 B1 | 6/2002 | Yoshiura | 380/269 |

OTHER PUBLICATIONS

Salomon D. Data Compression. The Complete Reference, Second Edition, Springer 2000 p.p. 62–64,67,126,151–157, 35–37.

Sedgewick R. Algorithms. Addison–Wesley Publishing Company, 1988, p.p. 93–98,333–342,509–514.

Niederreiter H. Random Number Generation and Quasi–Monte Carlo Methods Soc. for Ind. and App. Math. Phil. 1992, p.p. 165–171,175,191–204.

Rao K. Yip P. The Transform and Data Compression Handbook CRC Press, 2000, p.p. 13–15,35–37,61–63,73–75, 117–123,161–167,191.

Celko F. SQL for Smarties. Morgan Kaufman Publ. SF, 1995, p.p. 2–3, 10–11.

Storer J. Data Compression: Methods and Theory Computer Science Press, Rockville, MD, 1988. p.p. 6,7,10,11,103–111,114–115,126–128.

*Primary Examiner*—Leo Boudreau
*Assistant Examiner*—Duy M. Dang

(57) ABSTRACT

A dictionary based method of lossless compression and encryption of small redundancy data. A sequence of integer samples equivalent to a group of bits of input data, compared with samples of several dictionaries produced by random number generators. Frequency distribution of the samples of the dictionary transformed to be similar to the distribution of the samples of the input sequence. The sequence of the least distances obtained between every input numerical sample and the samples of the dictionary. The output sequence created with the sequences of these distances and the indexes of the samples of the dictionary, and used for a statistical compression. Calculated and assigned parameters accumulated in a protocol, providing lossless decompression. The process of substitutions of the output sequence for the input sequence repeated for compression or for encryption.

14 Claims, 15 Drawing Sheets

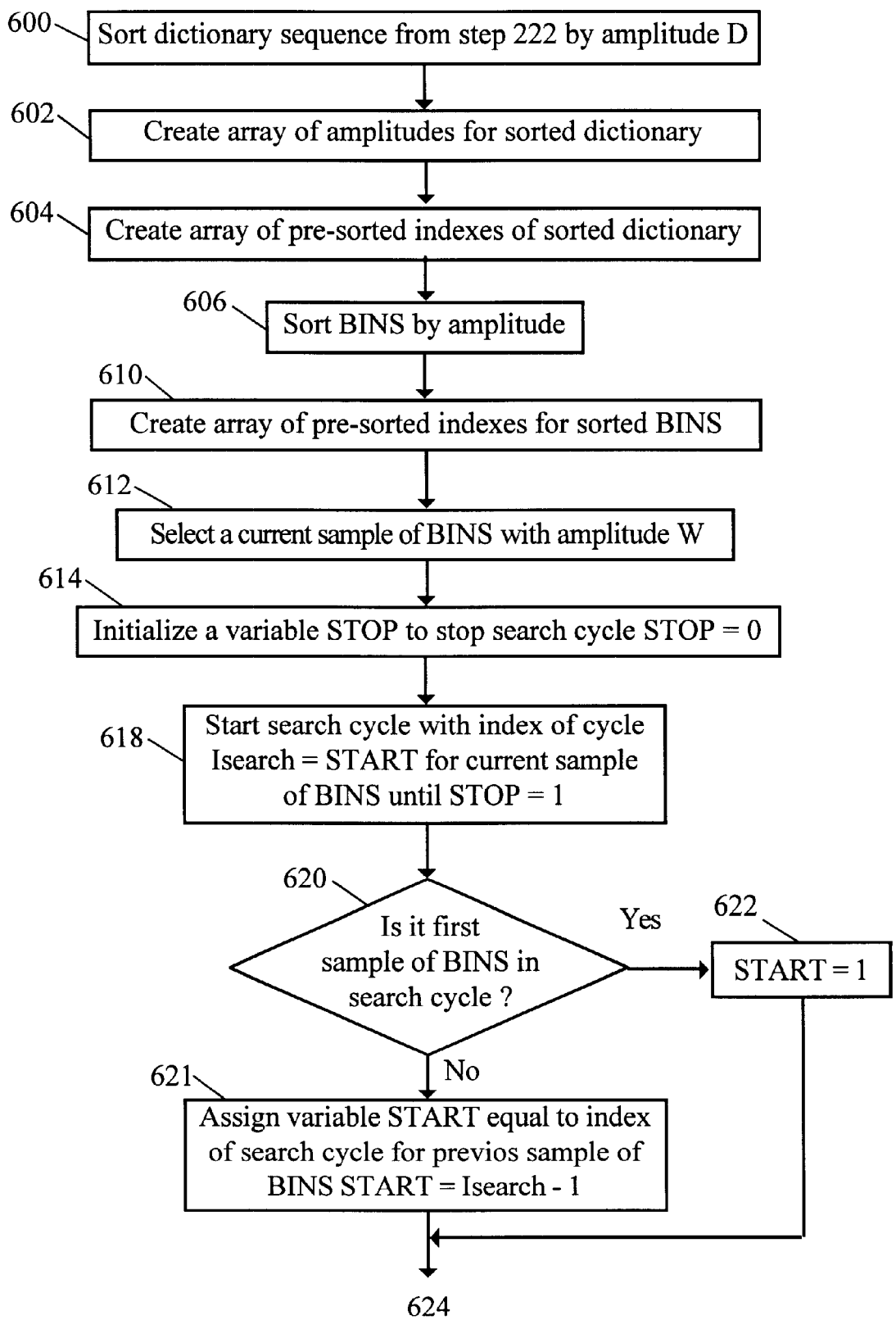
Fig. 6 (continue 1)

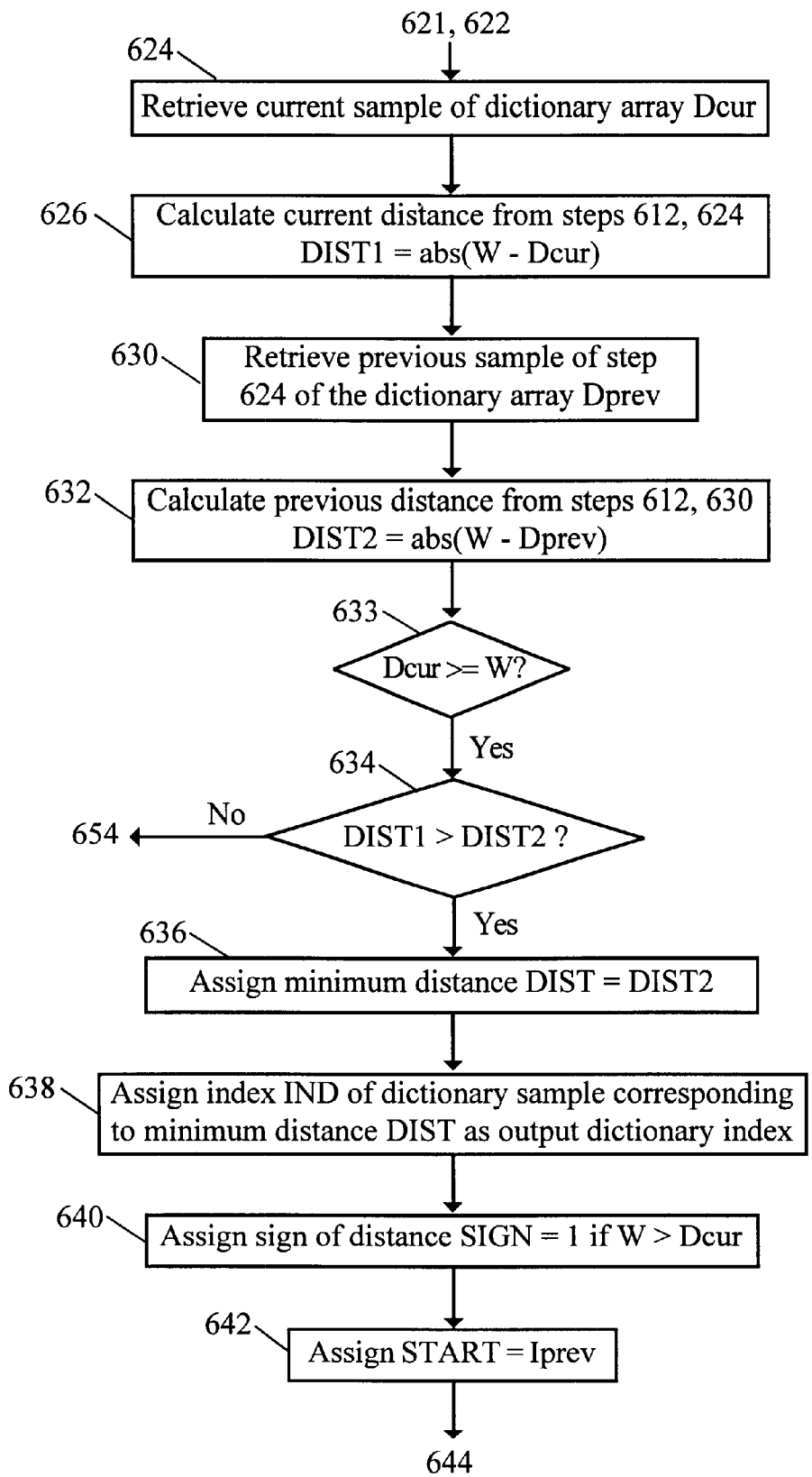
Fig. 6 (continue 2)

| 700 | 702 | 704 |
|---|---|---|
| CONSEQUENT BINS NUMBER: BINS_I | DIST1 - DISTN | IND_D1 - IND_DN |

| 706 | 708 | 710 |
|---|---|---|
| SIGN_DIST1 - SIGN_DISTN | SIGN_DIF1 - SIGN_DIFN | RANK1 - RANKN |

Fig. 7

| 820 | 822 | 824 |
|---|---|---|
| LENGTH OF BINS LW | AMPLITUDE Apeak | NUMBER OF RANKS Nrank |

| 826 | 828 | 830 |
|---|---|---|
| LENGTH OF DICTIONARY Lrng | SEED OF RNG S | CURRENT RANK R |

832
| MAXIMUM OF BINS MAXr FOR RANK r |
|---|

834
| MINIMUM OF BINS MINr FOR RANK r |
|---|

836
| NUMBER OF SAMPLES OF DICTIONARY SEQUENCE Nr FOR RANK r |
|---|

838
| NUMBER OF ITERATIONS FOR OUTPUT/INPUT SUBSTITUTIONS Nreq |
|---|

Fig. 8

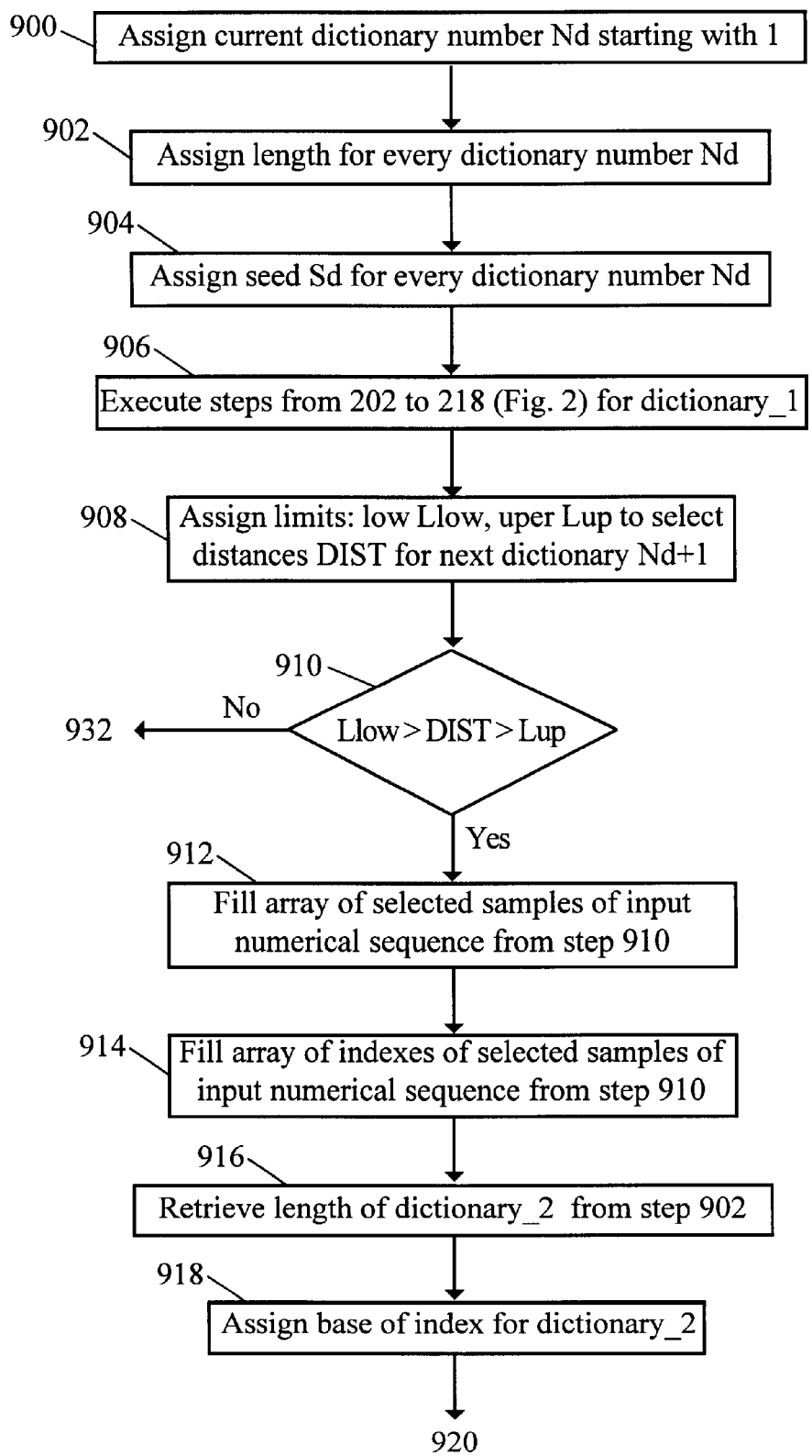
Fig. 9 (continue)

| 206 | 208 |
|---|---|
| LENGTH OF BINS (LW) | PEAK AMPLITUDE (Apeak) |

| 300 |
|---|
| NUMBER OF LEVELS FOR RANK (Nrank) |

| 302 |
|---|
| NUMBER OF DICTIONARIES (NUM_DICT) |

| 842 |
|---|
| CURRENT DICTIONARY NUMBER (DICT_N) |

| 844 |
|---|
| LIMITS TO SELECT DISTANCES FOR THE NEXT DICTIONARY NUMBER (Lup, Llow) |

| 846 | 848 |
|---|---|
| LENGTH OF THE CURRENT DICTIONARY NUMBER (LD_N) | INDEX BASE |

| 850 | 852 |
|---|---|
| SEED FOR CURRENT DICTIONARY NUMBER (S_N) | CURRENT RANK (r) |

| 854 |
|---|
| AVERAGE OF BINS Ar FOR RANK r |

| 856 |
|---|
| NUMBER OF SAMPLES IN BINS Nr FOR RANK r |

| 858 |
|---|
| MAXIMUM MAXr, MINIMUM MINr OF BINS FOR RANK r |

METHOD OF COMPRESSION OF BINARY DATA WITH A RANDOM NUMBER GENERATOR

CROSS-REFERENCE TO RELATED APPLICATION

This application is entitled to the benefits of Provisional Patent Application Ser. No. 60/377,683 filed May 4, 2002.

GOVERNMENT INTEREST STATEMENT AS TO RIGHTS UNDER FEDERALLY SPONSORED RESEARCH

Non-applicable

SEQUENTIAL LISTING OR PROGRAM

Non-applicable

FIELD OF THE INVENTION

The invention relates to dictionary based lossless data compression and encryption, particularly with respect to the manner in which the problem of statistical properties of the input data is treated.

BACKGROUND OF THE INVENTION

The term "data compression" refers to the process of transforming a set of data into a smaller compressed representational form, so that it occupies less space on a storage or that they can be transmitted in less time over a communications channel. The data decompression process complements a data compression process and is the process of restoration of the original set of data exactly if the process is lossless or to some approximation if the process is lossy.

Many techniques have been used over the years to compress digital data. However they all based on the same few basic principles: a statistical coding, a dictionary coding, or a decorrelation (see: Storer J. A., Data Compression: Method and Theory, Computer Science Press (1993), p.p. 6,7,10,11,103–111,114,115,126–128; Williams R. N. Adaptive Data Compression, Kluwer Academic Publishers (1990); Salomon D. Data Compression. Springer (1997), p.p. 35–37,62–64,67,126,151–157).

A major example of statistical coding is Huffman encoding (see, Salomon D. Data Compression, Springer (1997), p.p.62–67. In this method, it is assumed that certain bytes occur more frequently in the file than others. For example, in English text the letters have some special frequency distribution, and the length of the code assigned to specific letter is inversely related to the frequency of that byte in the file. These bit sequences are chosen to be uniquely decodable. Huffman encoding may greatly expand a file if the pre-assigned scheme assumes considerably different frequency statistics than the one actually present in the file. In the general case of a binary file, produced by a random source, the frequency distribution could be close to uniform, and Hoffman compression will fail.

The dictionary algorithms are variations of the Lempel-Ziv technique of maintaining a "sliding Window" of the most recent processed bytes of data and scanning the Window for sequences of matching bytes. The input data character stream is compared character-by-character with character sequences stored in a dictionary to check for matches. Typically, the character-by-character comparison is continued until the longest match is determined. Based on the match, the compressed code is determined, and the dictionary is updated with one or more additional character sequences. If the sequence is found, the length of the matching sequence and its offset within the Window are output; otherwise, a "raw" byte is output. One example of such scheme is described in U.S. Pat. No. 6,075,470 (Little), entitled 'Block-wise Adaptive Statistical Data Compression', issued on Jun. 13, 2000 (p.p 9–30). The scheme with parallel compression using different machines is described in U.S. Pat. No. 6,417,789 (Har at al) entitled 'Highly-Efficient Compression Data Format', issued on Jul. 9, 2002, that do not improve a rate of compression, if published statistical compression is not effective.

These dictionary algorithms require: a) a number of repetitions of the sequence, included in the dictionary; b) inclusion of the dictionary sequence in the output, so that matching rate must be high enough to actually achieve compression; c) an 'exact match' between sequences in an input Window and a dictionary. For example, the letters 'b' and 'c' do not match, and the compression will fail while with a binary coding the difference is only one bit. Many techniques use the process of adaptation to the statistical description of the data. In general, type-specific compression techniques may provide a higher compression performance than general-purpose algorithms on the file for which the techniques are optimized. However, they tend to have a much lower compression performance if the file model is not correct.

The decorrelation technique is applied to highly correlated data, like space or medical images, with wavelets or Fast Fourier Transformation, as a set of basic functions for an input image expansion. These transformations are described in details in: Rao K. R., Yip P. C., Eds. The Transform and Data Compression Handbook. CRC Press (2001), p.p. 13–15, 35–37, 61–63, 73–75, 117–123, 161–167, 191. If the input sequence is highly correlated, the coefficients of this transformation will decay rapidly, and the number of them could be cut-off, providing compression with some loss of information. These losses could be acceptable for a human perception of an image, but unacceptable for compression of text or executable files, which are not correlated, and when no losses are acceptable. It is also unacceptable for correlated diagnostic or intelligence images, for which the high-frequency component can have an important informative value. The method of using transformations with digital signal processing described in U.S. Pat. No. 6,333,705 (Amone), issued Dec. 25, 2001

One example of the decorrelation technique is described in U.S. Pat. No. 6,141,445 (Castelli et al.), entitled 'Multi-resolution Lossless/ Lossy Compression and Storage of Data for Efficient Processing thereof,' issued on Oct. 31, 2000, that used a lossy technique to produce the losseless compression by means of applying an orthogonal expansion (could be the wavelet expansion) to an input sequence. (p.p. 12–16). After an inverse transform and finding residuals between an input data and the wavelet transform. The sequence of residuals could be compressed using statistical techniques. That patent applied this approach to a general case of random binary data, disregarding the fact that it may be not correlated. However, it is not efficient in that case: the sequence of coefficients of these orthogonal transformations does not decay, and it can not be cut-off. As a result, the compressed file may be longer than the input file.

The difference dictionary scheme is described in U.S. Pat. No. 5,977,889 (Cohen), entitled 'Optimization of Data Representation for Transmission of Storage Using Differences from References Data', issued on Nov. 2, 1999. This scheme uses the difference in the number of characters between the dictionary sequence and the input data while the selected sub-string must exactly match the dictionary sub-string.

The data compression process removes redundancy from the data, and this procedure can be related to the process of data encryption. The term "data encryption" refers to the process of transforming a set of data into a new representational form that prevents unauthorized reading of this data from a storage or a communications channel. The data decryption process is the process of restoration of exactly the original set of data from the encrypted representation. U.S. Pat. No. 6,411,714 (Yoshiura at al) entitled 'Data decompression/decryption method and system', issued on Jun. 25, 2002, uses a statistical distribution of data and interlocked the processes of compression and encryption, but the process of compression is not improved.

A random number generator (RNG) is a software program or hardware circuit that uses a recursive mathematical expression or shifted operations in a register to produce a stream of random numbers. A random number generator is used in the prime art only to encrypt the data but not to improve compression. See, for example, U.S. Pat. No. 6,122,379 (Barbir), entitled 'Method and Apparatus for Performing Simultaneous Data Compression and Encryption', issued on Sep. 19, 2000. The next example of using RNG for a data coding is U.S. Pat. No. 6,351,539 (Djakovic), entitled 'Cipher Mixer with Random Number Generator', issued on Feb. 26, 2002, which does not perform any compression, but only encrypts the data using RNG. Because the RNG is actually a deterministic mean and its sequence is used in the deterministic order, these procedures can be broken. Besides, the process of compression is not successful for many data types, and any redundancy in the original data could be used to decode the ciphered information.

The hashing technique, which is actually a random transformation, is used mainly to perform an efficient sequence search. The compression procedure requests an exact match between an input string and a dictionary string (see, for example, U.S. Pat. No. 5,406,279 (Anderson at al), issued on Apr. 11, 1995). Distribution of the output from the hashing procedure cannot be adjusted to the distribution of the input sequence. Furthermore, the hashing procedure produces collisions because it sends the different numbers to the same place, and the process of transformation is degraded. The dictionary technique is described in U.S. Pat. No. 6,088,699 (Gampper), issued Dec. 25, 2001

In view of the above deficiencies of known data compression methods, the need exists for more efficient data compression techniques. The new trends in the technology of data processing and communication require a new approach to the old problems of data compression:

a) While microprocessing devices can achieve a high speed with parallel processing, big random memory and small energy consumption, mechanical storage means are the major obstacles to their use for hand-held and on-board computers, and it is very crucial to have a relatively high data compression ratio for data that can be stored in a compressed form.

b) While communication means and networks could use high-speed processors for sending and receiving sites, the time they need to occupy a channel is often unacceptable. This is especially important for communication with flying objects, including satellites because they need to transmit enormous amounts of data in a limited period of time while passing over areas where transmissions can be received, and with narrow bandwidth.

c) Business data warehouses have accumulated great amounts of data, for which the maintenance of these archives is an expensive and slow procedure, so that the data compression becomes an important tool to improve performance.

In many cases, including the ones listed above, it is preferable to use extensive computer power to compress and decompress data because it can result in a considerable competitive advantage. It is thus desirable to achieve the next goals, which are addressed by the present invention:

a) Use a calculated dictionary, instead of a dictionary derived from the input data, to eliminate the necessity of the inclusion of the stored dictionary in the compressed data.

b) Fit each sample of the input binary data with some level of approximation, instead of an trying to fit the random input data exactly with a dictionary derived from an a segment of input data; adapt a descriptive statistics of the calculated dictionary to the statistics of the input data, instead of adapting the dictionary to a set of exactly matched characters.

c) Apply the process of compression recursively, instead of stopping it if sub-strings in a dictionary do not match exactly the sub-string of the input.

d) Use the redundancy of the input data compared with a random calculated dictionary with the same frequency distribution, instead of relying on an unpredictable number of repetitions in the input data.

e) Use the transformation of the original data to a new sequence of approximated samples with RNG for data encryption with an excluded redundancy, utilizing a RNG in the order driven by the input data, instead of the order by which this dictionary sequence was generated.

SUMMARY OF THE INVENTION

The shortcomings of the known techniques are overcome and additional advantages are provided through the provision of a method for processing data, including the cases when these methods are impossible to use. In particular, the present invention introduces the concept of lossless approximation of a text, an image or executable files with an adaptive random number generator (RNG) that is used as a dictionary. This concept is presently unknown in the field of data compression and considered impossible. A solution that is simple and fast enough for practical implementation is found in the present invention.

An input sequence of a text or binary data is arranged in a sequence of groups of bits. Then each group is transformed into a sequence of samples of predetermined amplitude and length, that comprises a block of an input numerical sequence (BINS) in a memory mean. A frequency distribution then is found for the amplitudes of this BINS.

The present invention uses a RNG to generate a numerical sequence that covers the whole range of changes of BINS, and this RNG then used as a calculated dictionary. A certain transformation is then used to make the frequency distribution of the dictionary sequence similar to the frequency distribution of the BINS. As a result, the changes of the dictionary sequence are similar to the changes of the BINS not only in a whole range for a peak amplitude, but in a predetermined number of sub ranges. This operation reduces the distances between the samples of the input and the dictionary.

Each sample of the BINS is compared to all samples of the dictionary sequence in a look-up operation, until a dictionary sample is then found that has a least distance to the current BINS sample. The input sequence is then replaced with the sequences of the least distances and the indexes of the dictionary samples, which produced these distances. Thus the main problem with the currently available methods—producing an exactly matched dictionary—is eliminated. Then, the dictionary itself is eliminated from the memory, and does not comprise a part of the compressed data. Thereby the rate of the data compression improved further. As a result, an unpredictable and perhaps even uniformly distributed input sequence is transformed into the new sequence, where the subsequence of distances contains many repetitions and zeros. Thus applying currently available statistical or dictionary means to this new sequence gives better results of compression than if applied to the original sequence.

Because the length of the dictionary is predetermined to be smaller than a peak amplitude of the RNG, the average size of the index of the dictionary is smaller than its average amplitude, and the least distances are small too, thereby the output sequence requires less memory than the input sequence, thus achieving additional data compression. These properties of the output sequence improve the efficiency of data compression, where the current methods fail because the published techniques can only compress the data with a large enough number of repetitions and with an exactly matched dictionary, while in reality an input subsequence may be unpredictable. Furthermore, the RNG can be exactly reproduced during decompression. Thus a dictionary in the present invention is eliminated from the output data, which is considered impossible for the previous decompression methods. In the prime art the dictionary is the part of the output because it is not calculated, but continuously derived from the input data by a process of a perfect matching.

Further, we use our compression with several different RNG's to see which one leads to the least distances. Choosing then this RNG over the others would further improve the compression. As a result, the process of compression is improved by the operation of the consequent refinement if a rate of compression cannot be improved for the current BINS with one dictionary operation.

The parameters of the process of compression are accumulated in a protocol, thus allowing for a completely reversible decompression process. The protocol comprises predetermined and calculated parameters: the amplitude, lengths of input BINS and dictionaries, descriptive statistics for the input sequence, maximum, minimum and a metrics for a frequency distribution for the dictionary sequence for each RNG. The present invention provides for the efficient storage and transmission of the digital data.

The methodology described above is used with many repetitions in a loop, replacing the input with output sequence for compression and for encryption. Disregarding the results of the process of data compression, the same process is used for encryption, because the present invention always removes redundancy in the input data, that is the major factor used for unauthorized decryption. The next factor to improve the process of encryption is that the sequence of the RNG is used in the order of the best approximation of the input numerical samples, but not in the order as it is generated, which significantly improves the level of protection of the input data from an attempt to break the code, because the sequence of the RNG is permutated randomly.

As will be appreciated, the invention is capable of other and different embodiments, and its several details are capable of modifications in various respects, all without departing from the spirit of the invention. Accordingly, the drawings and description of the preferred embodiments set forth below are to be regarded as illustrative in nature and not restrictive.

BRIEF DESCRIPTION OF THE DRAWINGS

All objects, features, and advantages of the present invention will become apparent in the following detailed written description The illustrative embodiment when read in conjunction with the accompanying drawings, wherein:

FIG. 7 depicts the example of the output data, before it is used for LZ compression, in accordance with the principles of the present invention.

FIG. 8 depicts one embodiment of the process compression protocol, in accordance with the principles of the present invention.

THE BEST MODE FOR CARRYING OUT THE INVENTION

Definitions

Input data=binary data, representing a text, an image, an executable file, a database formatted data, or any other unspecified coded data.

Amplitude of Input Numerical Sequence=a sample of numerical data, representing binary input data after numerical formatting of a group of bits into the number.

Block of the input numerical sequence (BINS)=a group of consequent samples of the Input Numerical Sequence.

Index of an input sample=the position of a sample in the BINS.

Rank=the discrete variable, measuring the amplitude of the numerical sample.

Block of the dictionary=the group of consequent samples of the dictionary.

Index of a dictionary sample=the position of a sample in the block of the dictionary sequence.

Output data=compressed data, stored in a memory means or sent to a communication channel.

Positional compressing=data compression by means of packing of consequent number of bits from a sequence of smaller samples into fixed size memory cells.

Statistical compression=data compression, for example a Hoffman coding, by means of assigning of the code labels to input data in accordance with the frequency distribution of these input samples.

Dictionary compression=data compression by substituting of the input sequence with the labels, described by the position of the input sample with a matched subsequence in the dictionary.

LZ compression=dictionary compression with a look-ahead buffer, in an attempt to find a match between sub strings of an input file and said buffer, which filled with the results of the previous similar operation.

Random number generator=a software, or a hardware mean to generate a sequence of numbers by an operation of iterative numerical computations, that satisfy a predetermined statistical criteria of randomness.

Decompressed data=output of the decompressing operation to restore input data.

Volume of information =amount of memory occupied by a sequence, calculated as a product of the length of said sequence by either the average or the maximum number of bits in a sample of said sequence.

Encryption=transformation of the input data into the form, that prevent from unauthorized reading of the transformed data.

Level of protection of the input data=the process of encryption of the input data, measured by the amount of time required for an operation of decryption of the data by an unauthorized user.

The Basics of the Method

Figure 1A:
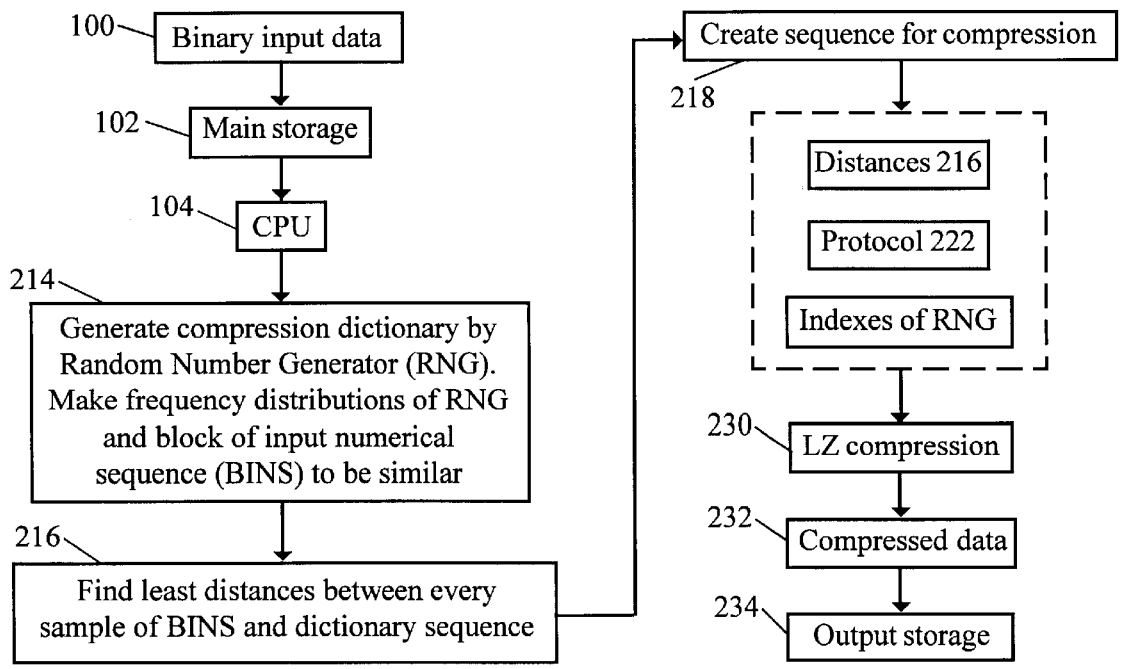
FIG. 1a is the block diagram of a preferred embodiment of the lossless compression, and FIG. 1b—of the decompression process incorporating a calculated dictionary adapted to a frequency distribution of the input file in accordance with the principles of the present invention.

Referring to the drawing, FIG. 1a shows the block diagram of a preferred lossless data compression process of the current invention. In one embodiment, the input data 100 is retrieved from the main storage 102 that incorporated and used in a computing system, such as the one depicted in FIG. 1. Computing system includes, for instance, one or more central processing units 104, and a storage system 234. As is known, central processing unit (CPU) 104 is the controlling center of computing system and provides the sequencing and processing facilities for Instruction execution, interruption action, timing functions, initial program loading and other machine related functions.

The central processing unit executes at least one operating system, which as known, is used to control the operation of the computer by controlling the execution of other programs, controlling communication with peripheral devices and controlling use of the computer resources. The storage and transmittal facility of the present invention is, in one embodiment, controlled by the operating system. Main storage 102 may be either physically integrated with the CPU 104 or constructed in stand-alone units. The output storage system 234 includes one or more of a variety of input/output devices, such as, for instance, communications controllers, on-board devices, magnetic storage media (e.g., tape, disks), and sensor based equipment. Data is transferred from main storage 102 to the output storage system 234. The present invention can be used within other computing environments without departing from the spirit of the present invention.

Prior to compression, the data to be compressed 100 is transformed by a numerical formatting procedure to the sequence of numerical equivalents of the input data. Although not shown explicitly in FIG. 1, an input data file is first broken into blocks of some particular size, preferably around 16 bits. Each block is then transformed into an associated numerical equivalent with a predetermined peak amplitude, preferably around 65536. A number of these samples, optimally about 10,000 is consequently stored in a BINS. An addressable memory area is used for the BINS to speed-up the process of compression.

Extensive software simulation of the compression method was performed during the development of the present invention. Various values of all parameters, including the length of the BINS and the dictionaries, the peak amplitude of the samples, the number of levels (ranks) to select samples by the amplitudes from the BINS after compression with the first dictionary for the next dictionary were tested to determine their impact on throughput and compression ratio. The particular format and the set of parameters in the preferred embodiment were selected to optimize performance.

A compressing dictionary 214 is generated by a RNG. This RNG generates a short sequence of samples of the dictionary, which changes in the same range of changes as the numerical sequence of the input data. The frequency distribution of the dictionary sequence is transformed to be similar to the frequency distribution of the input sequence. As a result the dictionary sequence changes not only in the whole range of changes of the input data, but even in all sub ranges of the whole range. In the beginning of the process of data compression, parameters of this RNG are predetermined. A length of the RNG is selected to be sufficient to produce enough different samples to match approximately the multiple amplitudes of the input numerical sequence. The peak amplitude of the dictionary 214 is smaller than the length of the dictionary. The length of the dictionary is preferably compatible with the length of the BINS. The input numerical sequence is algebraically compared with this RNG sequence.

The next operation 216 finds the least distance from every consequent sample of the BINS to a sample of the dictionary sequence (the 'best' one). This dictionary sample is identified by its index. These distances are small, and they occupy only little memory. The input data is replaced with the sequence 218, comprised of the sequences of least distances 216, the protocol 222 and the indexes of RNG 214.

As a result, the sequence 218 should occupy less space in the memory, than the original input sequence. Another positive effect of the operation 216 of approximation of the input data is that the originally uniformly distributed BINS with large amplitudes and a small number of repetitions is transformed into the sequence, that concentrates near of the zero and has many repetitions. This improves the performance of statistical or LZ dictionary compression 230 to produce the compressed sequence 232, which is then sent it to the output storage 234. These operations are described in detail below.

The process described above can be repeated several times in a loop, and the output sequence gets encrypted, because the redundancy of the input data is removed from the output data, and the samples of the RNG are used not in the order they were generated, but in random order to approximate the BINS. As a result, the process of encryption is more secure than the encryption of the original data. Any other known encryption methodology can be additionally applied. It will be obvious to those skilled in the art, that the sequence of the protocols can be encrypted, stored or transmitted separately and differently from the compressed file of the distances and indexes to further improve the level of protection. The various other changes of the encryption process may also be made without departing from the spirit and scope of the current invention.

The predetermined and calculated parameters of the process of compression accumulated in the area of memory that comprised the protocol 222, which is described in detail below. The compressing dictionary 214 is not a part of the output data, which increases the efficiency of the present invention: once the least distances 216 are determined, the dictionary 214 is eliminated from the memory because it can be reproduced for decompression with the protocol 222.

Figure 1B:
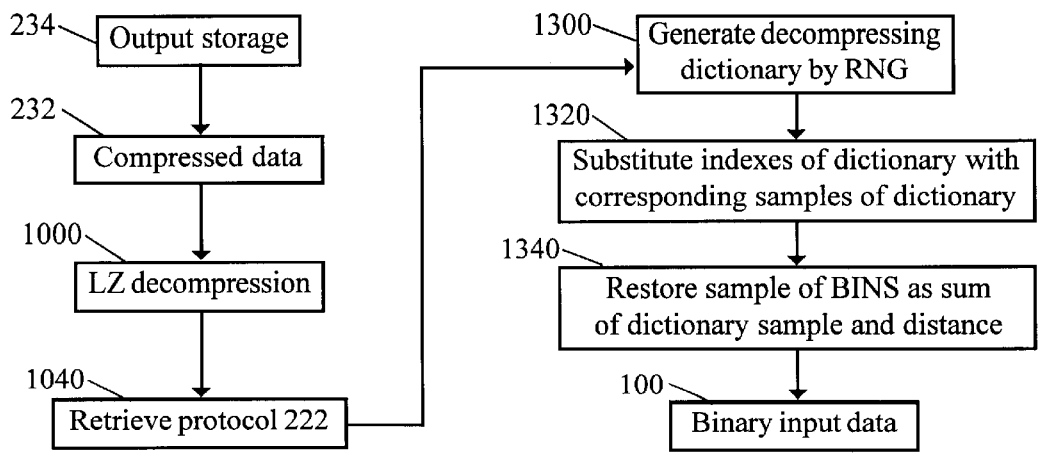

Referring to the drawing, FIG. 1b is the block diagram of the preferred operation of the data decompression for the current invention. Compressed data 232 is extracted from the output storage 234, and the operations are performed in the order opposite to that used for compression (compared with FIG. 1a), starting from LZ decompression of the data 1000. The parameters to generate RNG are extracted then from the protocol 222. As a result, the generated by RNG decompression dictionary is exactly the same, as the compression dictionary 214. The dictionary is a table of the samples and the corresponding indexes, and this table used for an inverse operation. The indexes of RNG retrieved from the compressed data 232, substituted with the corresponding samples of RNG that are algebraically added to the distances in the operation 1104 to restore the input data. As a result, the processes of compression and decompression are completely reversible, and input data 100 are restored.

The Operation of Compression in Detail

Figure 2:
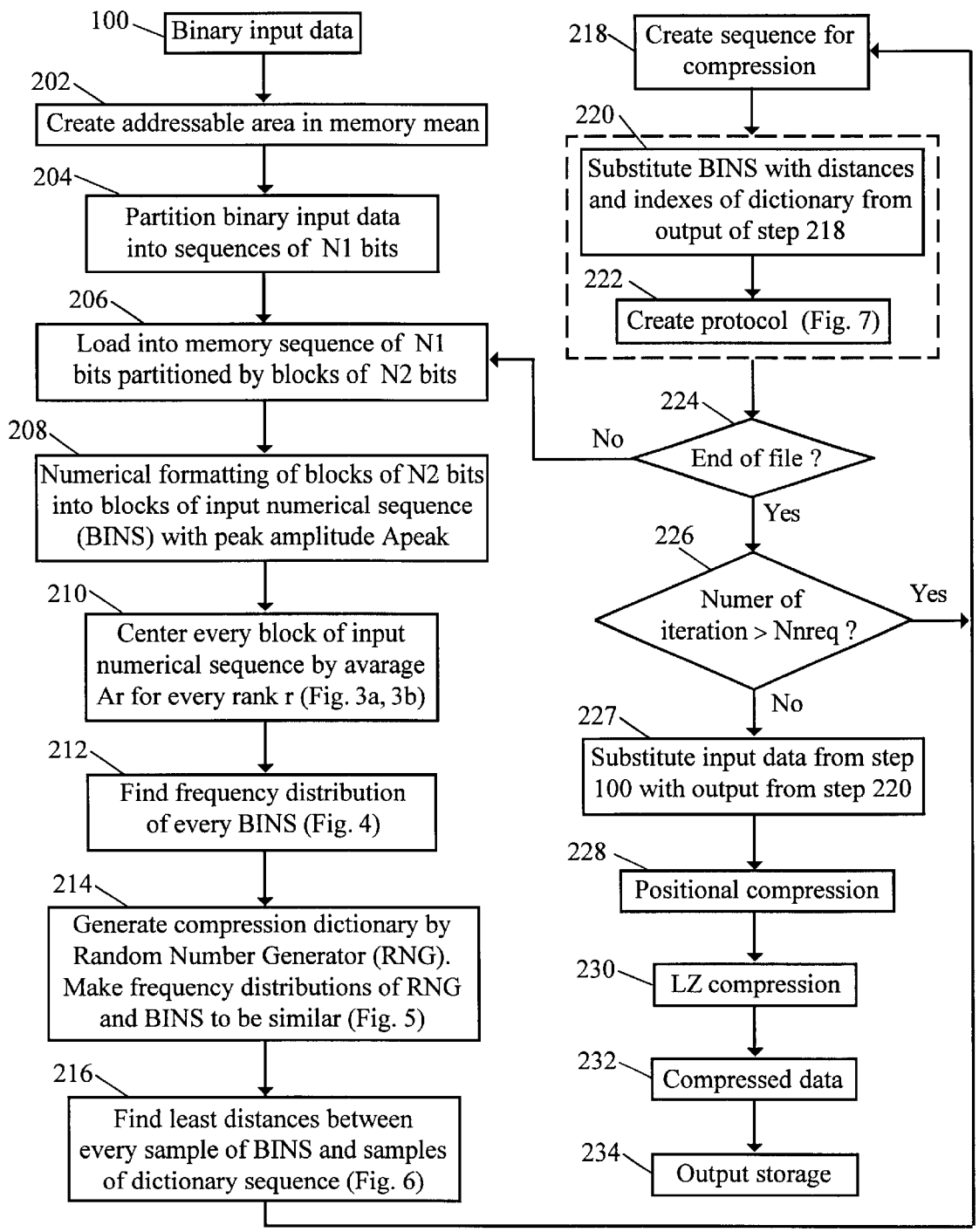
FIG. 2 is the block diagram of a preferred logic of the major operations in detail, associated with an approximate matching binary data, transformed to blocks of numerical input sequence (BINS), with a random adapted dictionary, in accordance with the principles of the present invention.

Referring to the drawing, FIG. 2 is a block diagram of preferred lossless data compression with the detailed explanation of the major flow of the process of compression, while all major operations are described in details below. The operation of compression is started by creating the BINS 202 in an addressable memory area to keep the consequent blocks of the input data. The objective of blocking the BINS is to perform operations faster, with one input/output transaction, to work with a large input file using a small random memory of a micro-device. The blocks of binary samples are loaded in the memory.

The input data file is partitioned into groups of N1 samples in step 204. For binary data, one sample could be a group of bits, or a memory word, for text data—a binary equivalent of any alphabet provided. As a result, this operation creates a sequence of bits. In step 206 a group of N1 samples is loaded in the BINS and this sequence partitioned into blocks of N2 bits, preferably equal to about 16, with a numerical equivalent produced by the operation of numerical formatting in step 208 with a peak amplitude Apeak.

Those skilled in the art recognize that the values of all numeric or text parameters are transformed from binary data and back, by a standard procedure, like with the ASCII code table. For example, 16-bits words produce samples with the peak amplitude 65536. A numerical equivalent can be associated with every member of a sequence of words or phrases by a formatting procedure. As a result of these steps up to step 208, the data that originally are not numerical, are converted to numerical data, and any mathematical calculations can be applied now to these numerical samples (like addition, multiplication, division)—while they were meaningless for the original text or binary data. For example, a sequence of words with the numerical equivalents in brackets: 'glucose' (10), 'cholesterol' (12), 'lymphocytes' (14) has an integer average rounded (10+12+14)/3=12, residuals are: −2,0,2.

Figure 3A:
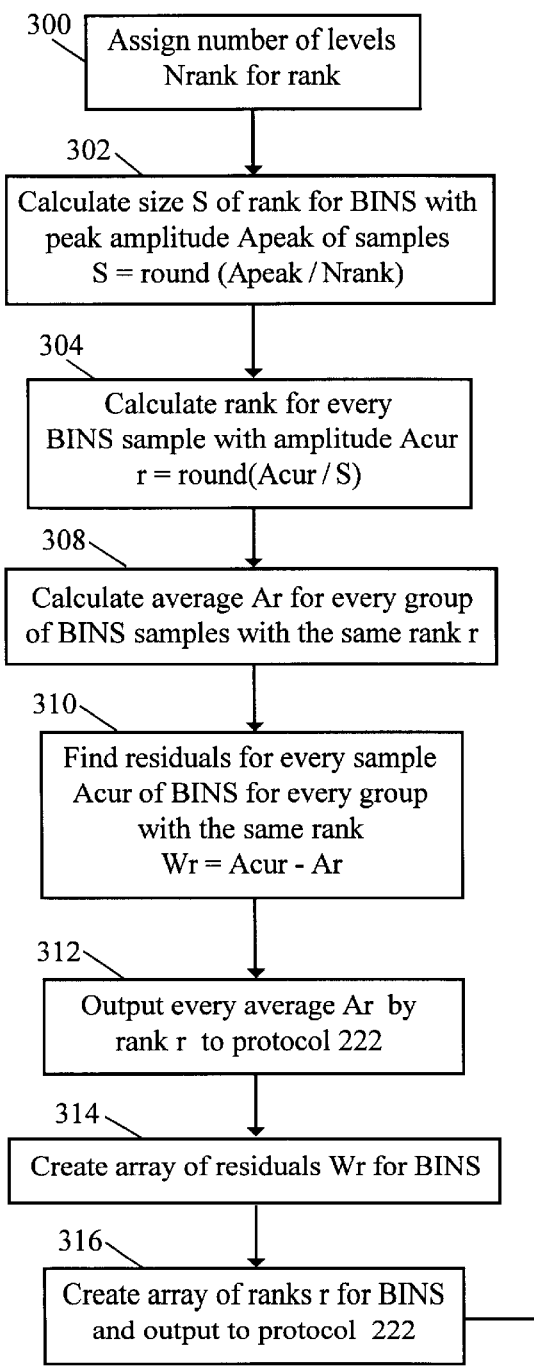
FIG. 3a is the block diagram of the preferred logic of the operation of ranking and centering the samples of the BINS in accordance with the principles of the present invention.

Objective of the next operation 210 is to transform the sequence with a large peak amplitude into a sequence with a small range of changes that will improve the efficiency of the later steps of an approximation of the BINS by the dictionary sequence. A short-length sequence of RNG will cover better the BINS with a smaller range than the original BINS. The range is reduced by a centering of the BINS and using the residuals instead of the original BINS. The numerical samples are classified according to the level of amplitude of every consequent sample, that is the rank of every sample. Step 210 calculates these ranks, assigns the ranks to a block of input numerical samples, and centers the samples in a group with same rank by the average in this group. A table of the averages with the corresponding ranks is outputted in protocol 222. This operation of averaging is reversible because the sequence of centered samples is accompanied by a sequence of corresponding ranks, and with averages from the protocol, the original BINS can be always restored. FIG. 3a will describe this operation for a repeated operation of averaging.

Figure 4:
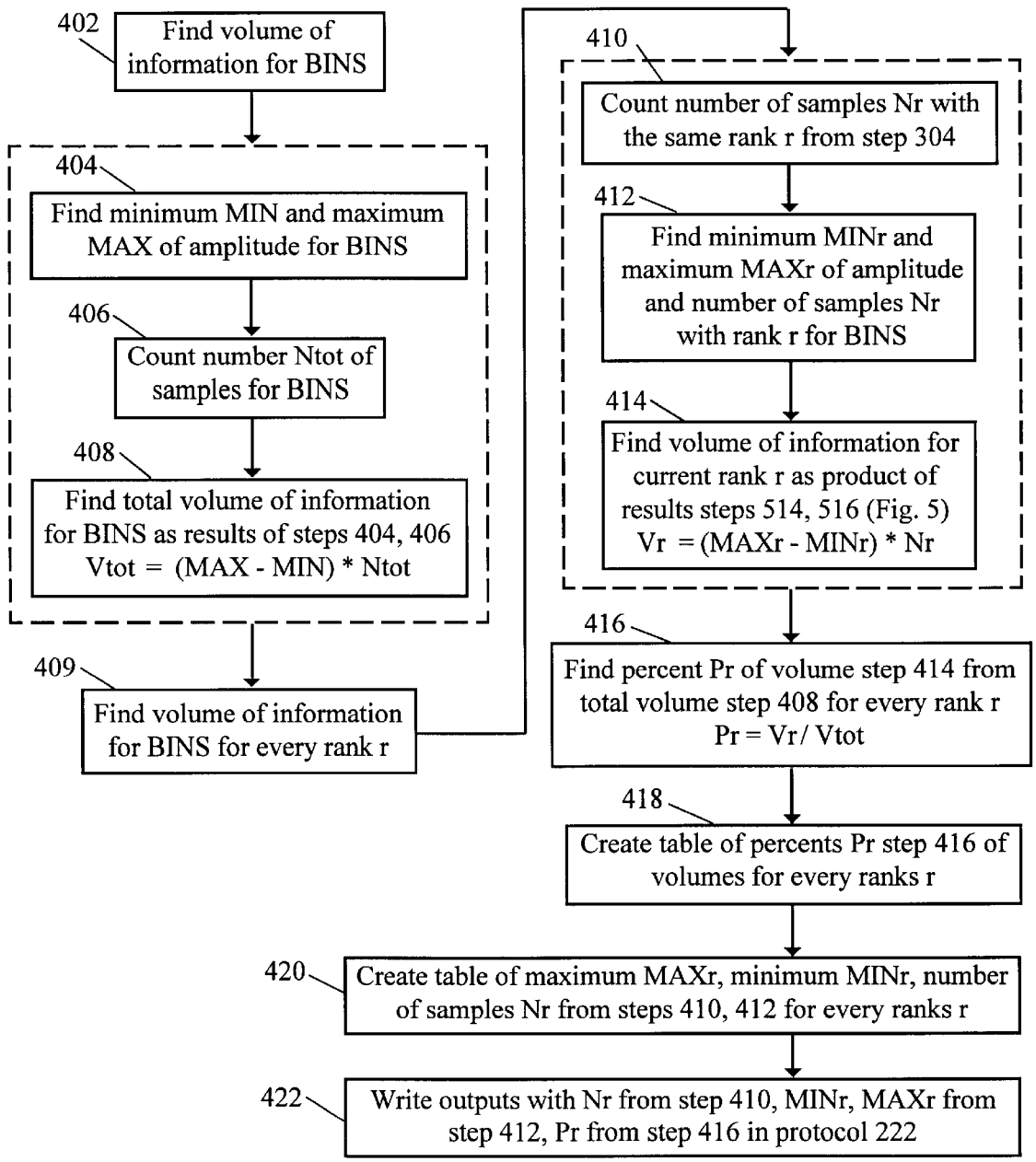
FIG. 4 is the block diagram of the preferred logic of the operation to find the description of a frequency distribution of the BINS in accordance with the principles of the present invention.

The objective of the next step 212 is to calculate and to describe the frequency distribution of the BINS. This distribution is calculated and described by the metrics, associated with sub ranges of the whole range of the numerical samples, and these sub ranges are defined by a rank variable for the amplitude of the numerical samples calculated in step 210. FIG. 4 describes this operation in more detail. Parameters of this distribution are accumulated in protocol 222, and used to generate the dictionary for compression and to restore the dictionary later for decompression.

Figure 5:
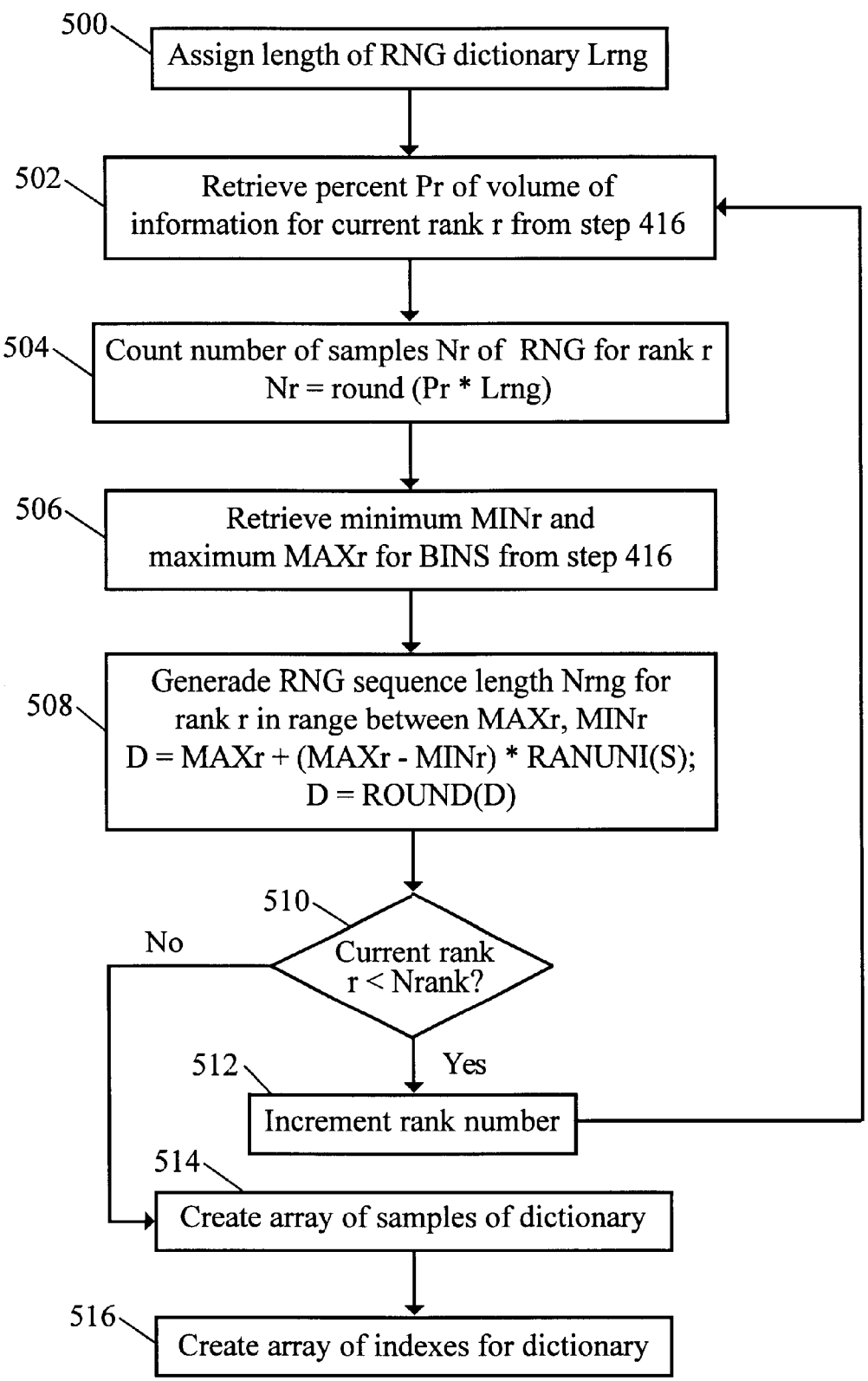
FIG. 5 is the block diagram for the operation of generating a compressing dictionary, in accordance with the principles of the present invention.

Operation 214 generates the dictionary by the RNG. The standard RNG generates the sequence of numbers between 0 and 1 with a uniform distribution, but with a proper transformation this sequence can be converted to a sequence with a predetermined range and required shape of distribution. FIG. 5 describes this operation with further details. A frequency distribution of the dictionary is transformed to be similar to the frequency distribution of the BINS, As a result, a sequence of samples of the dictionary is close in amplitudes to the BINS in the whole range of its amplitude, and the random dictionary sequence is effectively used to approximate the random input numerical sequence.

The length of the dictionary is an important resource of the current invention. If this length is small, the index, that describes a position of the dictionary sample in the generated dictionary, will be small too, and this part of the output from the procedure of matching the sequence 218 will occupy a small space in a memory. But a short dictionary could produce large outliers, because with a small number of dictionary samples it is difficult to find the particular one which will match a random sample of the BINS with a wide range of changes. As a result of extensive modeling, the length of the dictionary is recommended to be about the same as the length of the BINS.

Figure 6:
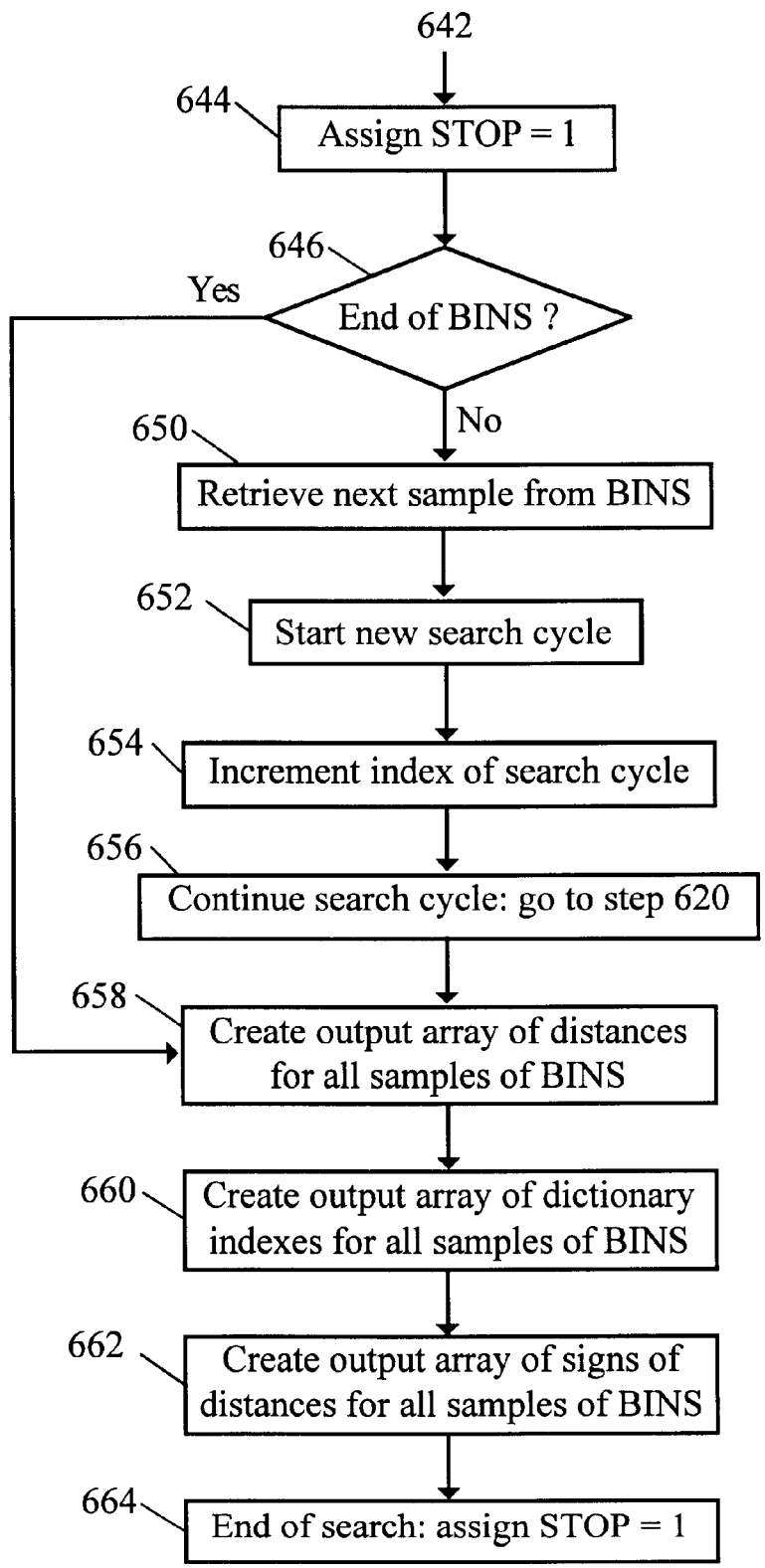
FIG. 6 is the block diagram for the operation of a preferred logic to find the least distances between the input and the dictionary sequences, in accordance with the principles of the present invention.

As the next step, the dictionary is used for the closest possible approximation of the random input data in the operation 216—to find the least distances between every sample of the BINS and the samples of dictionary sequence. FIG. 6 will describe this operation with further details The next operation 218 creates the sequence for compression. This operation comprises of steps 220 and 222. Step 220 substitutes the BINS with the least distances, founded by step 216 and indexes of the samples of the dictionary that produced these distances. Step 222 creates a protocol, that keeps the parameters of the frequency distribution from step 212, and all other parameters of the previous operations, to provide these operations are reversible for the operation of decompression later. FIG. 7 describes the protocol 222 in details.

Operation 224 checks if the end of the input file is reached. If 'No'—the new block of the BINS is filled with the input data in step 206, and the operation is continued. If 'Yes', the operation is transferred to step 226 to check the next logical condition—a number of cycles to repeat steps 210–222. According to the current invention, the output from the operation of the data compression can be redirected to an input of the next cycle of the data compression. The number of cycles of compression compared with the predetermined number of iterations Nreq. Operation 227 replaced the input data 100 with output data step 220, to repeat operations described in FIG. 2 by steps from 204 to 224 a predetermined number of times Nreq. The predetermined number of iterations Nreq limits the consumption of the computer time and the rate of achieved compression.

The number of iterations defined by trial and error, according to a selected criterion: maximizing a compression ratio; minimizing duration of an operation; minimizing a time of transmission of compressed input data. If the logical condition 226 is true, the next operation is step 218 to create a new sequence for compression. As a result, the level of protection of data for ciphering and the rate of compression may be improved. The current implementation uses one cycle of this operation of substitutions. It will be obvious to those skilled in the art, that the particular component of the output sequence, like least distances or indexes, can be compressed, encrypted, stored or transmitted separately from other components to improve the rate of compression further. The different components have different statistical properties, (for example, the least distances are correlated), and many available methods of compression can produce better results if they are applied to these components separately. Various other changes of the compression process may also be made therein without departing from the spirit and scope of the current invention.

The samples of many components of the output sequence 218 occupy only a part of a memory cell. In the next step 228 the output sequence 218 is used as the input to the operation of a positional compression 228. The important part of the output is the subsequence of the distances. The peak amplitude of this subsequence could be three bits or smaller, so a memory cell of the memory mean, which could be 16 bits, is packed only partially, which provides an option to shift the samples in the memory cells- to pack this cell. As a result, the packed sequence will occupy less memory than the original output sequence. For example, the sequence of the distances: 3 2 0 2 has the binary representation 11 10 00 10, which needs one byte of the memory for this whole sub string. The sequence of the signs is represented by the samples that occupy only one bit each, and the operation of shifting packs the memory cells, as explained later.

In accordance with the principles of the present invention, the redundancy of the input data is treated as a redundancy of a difference between the BINS and the numerical dictionary; the latter covers the same range, with the same distribution, as the amplitude of the numerical input. As a result, a new sequence is produced, that may occupy a smaller space in the memory, but there are more options to improve the rate of compression. All samples of the distances concentrated near the zero, indexes of the dictionary are small enough, and a published dictionary compression methods, like LZ compression 230, can be applied more effectively to the generated output 218, than to the original input sequence.

The published dictionary compression means are available in a number of off-the-shelf products, such as the WinZip for Windows, offered by WinZip Computing Co; COMPRESS, a package available in the Sun-Unix operational system. Dictionary compression is also described in: Storer J. A. (1993), Data Compression: Method and Theory, Computer Science Press, which is hereby incorporated herein by reference in its entirety. LZ-compression is only one example, however. Any reversible transformation that allows statistical or dictionary compression can be used. Compressed data 232 is the final result of the operations described by FIG. 2 and it is accumulated in the output storage 234.

Statistical Description of an Input Sequence

Referring to the drawing, FIG. 3a is a block diagram of a preferred operation to improve the efficiency of the process of approximation of the BINS with the random dictionary sequence. The first step to achieve this goal was described by FIG. 2, as the BINS that is random and has a wide range of changes, transformed into a sequence with a narrow range of changes by centering the sequence in a sub range of the peak amplitude of the BINS.

This goal is achieved further by means of the calculation of a selected metric, describing a frequency distribution for every sub range. As a result, the dictionary approximates the residuals for a very small sub range, and outliers are smaller. For this purpose step 300 assigns a number of levels Nrank for the rank r, that is recommended about six. The next step 302 calculates the size of a rank as $$S = \text{round}(A\text{peak}/N\text{rank})$$

where S=a size of the rank, Apeak=a peak amplitude of the block of the BINS. The next step 306 calculates the rank for every BINS sample as $$r = \text{round}(A\text{cur}/S)$$

where r=a rank, Acur=an amplitude of a current sample.

The ranks are assigned to the corresponding samples. The next step 308 calculates the average Ar for the samples with the same rank. Step 310 calculates residuals Wr for every sample of the BINS for every group of samples with the same rank r as $$Wr = A\text{cur} - Ar.$$

Step 312 outputs every average Ar by ranks r to the protocol 222, to provide reversibility of the process for decompression, as will be explained in more detail below. Further operations accelerate and simplify by the creation of arrays. Step 314 creates an array of residuals from step 310. Step 316 creates an array of ranks from step 304. Step 318 creates an array of signs for the absolute residuals, calculated by step 310. As a result of this operation, a numerical sequence that has a wide range of changes is transformed to a sequence with a substantially smaller range. Now the random dictionary sequence is used to approximate the sequence with a small range, and outliers will be smaller too. With the arrays of signs, ranks and averages, this operation is completely reversible.

For example, let the BINS be 98 105 103 32 98 114 111 119 110 32 100 111 103. The peak amplitude Apeak is 119. The size of the rank S=round (119/6)=20. The array of ranks, calculated according to step 304, is 5 5 5 1 5 6 5 6 5 1 5 5 5. The grouping of the BINS samples by rank can not be a physical one, but by the pointers to the array elements with the same rank. For the rank 1 the average AV1=32, for the rank 5 AV5=104, for the rank 6 AV6=111. Residuals (absolute): 6 1 1 0 6 0 3 5 6 0 4 7 1 with the average=3 and the range=7. The sequence of signs of residuals is: −+−+−++−+−−−. The sequence of signs needs one bit for a sample.

Figure 3B:
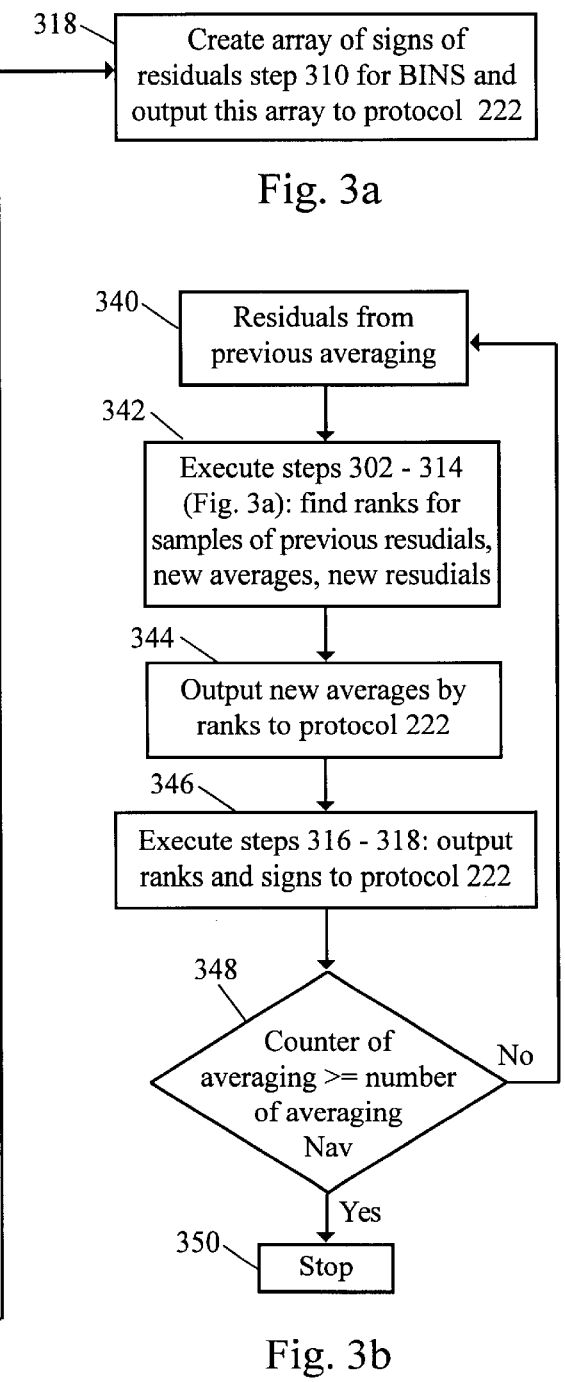
FIG. 3b is the block diagram of the preferred logic of the multiple ranking and centering operation for the samples of the BINS in accordance with the principles of the present invention.

This operation of centering by ranks, steps 308–314, can be repeated: the sequence of residuals after the first centering can be treated in the same way as the original input sequence assigned with a sequence of new ranks, averaging by these new ranks and centering. Referring to the drawing, FIG. 3b describes this operation with further details. The next table of the ranks and the averages accumulated in the protocol 222, as well as a previous one, provides reversibility of the process of compression and decompression. A positive effect of this repetition is that residuals will be decreased, but a negative effect is that an additional space will be spent to keep a sequence of ranks for every cycle of centering.

Step 340 (FIG. 3b) accumulates residuals of the previous, (after the first one), operation of averaging. Step 342 executes steps 302–314 (FIG. 3a), finds the ranks for samples of residuals, the averages, the residuals- for the current cycle of averaging. Step 344 outputs the averaging in the current cycle by rank to the protocol 222. Step 346 executes steps 316–318, output ranks and signs of residuals to protocol 222. Step 348 performs a test: is a count of averaging greater than or equal to a predetermined number of averaging Nav? If the answer is 'YES', the cycle of averaging is stopped. If the answer is 'NO'—GOTO step 340 to continue the cycle of averaging. The number of centering is selected by a process of trial and error for a particular application; in the current invention for a preferred mode one procedure of centering was used.

Referring to the drawing, FIG. 4 is a block diagram of a preferred operation in detail to find the frequency distribution 212 (FIG. 2) for the transformed samples of the BINS. The objective of this step is to prepare the operation of the adaptation of the dictionary to the frequency distribution of the BINS. As a first step, the preferred embodiment uses the range of changes of the amplitude of this sequence and the number of the samples in that range. The number of ranges is predetermined; this number is the same as the number of ranks Nrank from step 300. This simple metric provides a high speed of computer operations, although many other metrics could be applied. The different methods of describing frequency distributions are provided in Niederreiter H. Random Number Generation and Quasi-Monte Carlo Methods, Society for Industrial and Applied Mathematics, Philadelphia, Pa. (1992), and Sedgewick R. D. (1989), Algorithms, Second Edition, Addison-Wesley Publishing Company, Reading, Mass., which is hereby incorporated herein by reference in its entirety.

The rank, the number of samples and the range of the amplitude, related to this rank describe the shape of the frequency distribution. While this description is simple, it is not the best one for the preferred embodiment. A good metric should assign more samples of the dictionary to an area of changes of the samples of the block of the BINS where more outliers could be expected. In the preferred embodiment the present invention uses the composite metrics, the product of the range of the amplitude by the number of samples related to a group of samples with the same rank. This parameter is named here as 'volume of information'. As the next step, a percent is calculated of the volume of information for every rank from the total volume of information for the whole range of changes of the amplitude of the BINS. A number of samples of the RNG generated according to this percent for every rank, and the area with more changes of the BINS has more samples of the dictionary to find a better approximation, as is explained in detail later.

Step 402 finds the volume of information for the block of the BINS and comprises the operations in steps 404–408. Step 404 finds a maximum (MAX) and a minimum (MIN) of the amplitude of the samples in the BINS. Step 406 counts the number of samples Ntot of this BINS. Step 408 finds the total volume of information for this BINS as $$Vtot = (MAX-MIN)*Ntot.$$

Step 409 finds the volume of information for the BINS for every rank r, and comprises the operations in steps 410–414. Step 410 groups samples in the BINS by rank, assigned in step 304. Step 412 finds the minimum MINr, the maximum MAXr of amplitude, and the number of samples Nr with the rank r. Step 414 finds the volume of information Vr for the rank r as $$Vr = (MAXr-MINr)*Nr.$$

Step 416 finds the percentage of the volume of information for the rank r from the total volume of information as $$Pr = Vr/Vtot.$$

Step 418 creates the table of the percentages Pr calculated by step 416 for an every rank r. Step 420 creates the table of MAXr, MINr, Nr by the rank r, and step 422 outputs this table in the protocol 222. These tables are used later to generate the dictionary with the shape of the frequency distribution that is similar to the frequency distribution of the BINS and with the same ranges. For the above example, the number of the samples with the ranks 1,2,6: N1=2, N5=9, N6=2. The table of maximums and minimums by ranks: MAX 1=32, MIN1=32, MAX5=111, MIN5=98, MAX6=119, MIN6=114. The volumes by ranks: V1=32*2=64, V5=111*9=999, V6=119*2=238. The total volume Vtot=64+999+238=1301. The table of percentages by rank: DCUR=64/1301=0.05, P5=999/1301=0.77, P6=238/1301=0.18. The number of samples of the RNG for the rank=1 N1=1, for the rank=5 N5=10, for the rank 6 N6=2. A maximum and a minimum in the group for the rank r described by the list (MINr, MAXr, r).

Generation and Adaptation of a Dictionary

Referring to the drawing, FIG. 5 is a block diagram of a preferred operation in detail to generate a compressing dictionary by RNG (operation of step 214, FIG. 2). The objective of this operation is to generate the dictionary sequence that is distributed similarly to the distribution of the BINS. This dictionary covers the changes of the amplitude of the BINS in the sub-ranges. The length of the dictionary should not be made large, because then the average size of a sequence of indexes will be large too, and it will occupy large amount of memory in the output sequence 218.

The preferred implementation uses the sequence of RNG in the best mode: the number of samples of the RNG will be greater for the ranks with increased percent of the volume of information. Step 500 assigns the predetermined length Lrng of RNG sequence for the dictionary, preferably about 10,000, that is about the same, as the length of the BINS. Step 502 retrieves the percent of the volume of information Pr for the current rank r from step 418.

Step 504 counts the number of samples of the dictionary for the current rank r as $Nr=\text{round}(Pr*Lrng).$ Step 506 retrieves the maximum MAXr and minimum MINr for rank r for the BINS from step 416. Step 508 executes a standard program or a hardware mean that generates the RNG with Nr iterations=number of dictionary samples for rank r with amplitude Dr=amplitude for rank r, according to the expression:

$Dr=\text{MIN}r-(\text{MAX}r-\text{MIN}r)*\text{RANUNI}(S)$ $Dr=\text{round}(Dr)$ where RANUNI (S)—a standard function to generate the random number sequence between 0 and 1 with uniform distribution and the seed S=predetermined initial value to start the iterations (at usually S=0). If the function RANUNI is equal to 0, Dr is equal to MINr, and if the function of RNG is equal to 1, Dr is equal to MAXr.

Random number generators are available in a number of off-the-shelf products, such as MathCad, offered by Math-Soft Co.; SAS, offered by SAS Institute. The different methods of generating the RNG are provided in: Niederreiter H. (1992), Random Number Generation and Quasi-Monte Carlo Methods, Society for Industrial and Applied Mathematics, Philadelphia, Pa., and Sedgewick R. D. (1989), Algorithms, Second Edition, Addison-Wesley Publishing Company, Reading, Mass., which are hereby incorporated herein by reference in its entirety. Hardware means for generating the RNG are described in U.S. Pat. No. 6,351,539 (Djakovic), which is hereby incorporated herein by reference.

Step 510 provides repetition of the operation to generate a sequence by the RNG with the assigned number of samples and the statistical description for steps 502–508 for every rank. It checks the logical condition: is the current rank number less than the predetermined number of ranks Nrank from step 300? If 'YES'—GOTO step 512 to increment the rank number and after that—GOTO step 502 to repeat an operation to generate RNG for the next rank r. If 'NO'—GOTO step 514 to create an array of samples of the dictionary for samples Dr and step 516 creates an array of indexes of these samples in the dictionary. As a result of these operations, described by FIG. 5, the dictionary created as a numerical sequence that closely matches the numerical sequence in the BINS: the maximum and the minimum of the dictionary are the same as for the BINS, and the shape of the frequency distribution is similar. If there is A GREATE volume of information in a particular sub-range of the BINS data, the dictionary has more samples there.

Approximation of the Input Sequence by the Dictionary

Referring to the drawing, FIG. 6 describes the best mode of preferred operation 216 in detail to find the least distances. The objective of operation 216 is to prepare substitution of the large and random samples of the BINS having an unpredictable number of repetitions with a small concentrated near to zero distances between these samples and the samples of the dictionary and with many repetitions.

The problem here is that because both sequences (the BINS and the dictionary) are random, traditional analytical tools of approximation are not efficient. This problem is solved in the preferred implementation by means of an operation that for every current sample of the BINS searches through the whole dictionary sequence to find the sample with the smallest distance between these two samples—of the BINS and of the dictionary. This operation can be described by the SQL programming language, that used by those skilled in the art, and it is available in many off-the-shelf products, such as Microsoft Access 2000 Data Base, offered by Microsoft Co.; SAS, offered by SAS Institute. The description of this language is provided however in Celko J. SQL for Smarties: Advanced SQL programming, Morgan Kaufmann Series in Data Management (1999), which is hereby incorporated herein by reference in its entirety.

Here is a description of the SQL program to find the least distance between samples from two sequences in SAS SQL version 8.01 (SAS is a commercial statistical analysis software package, and different dialects of the programming language differ insignificantly):

proc sql noprint;
create TABLE DISTANCE as SELECT DICT.SAMPLE_DICT, BINS.SAMPLE_BINS, DICT.IND_DICT, BINS.IND_BINS, BINS.RANK_BINS, DICT.RANK_DICT, ABS(DICT.SAMPLE_DICT-BINS.SAMPLE_BINS) as DIST From DICT, BINS group by SAMPLE_BINS having calculated DIST =MIN(DIST);
quit;

where DICT=dictionary table, composed of retrieved variables: samples (SAMPLE_DICT), indexes (IND_DICT), and ranks (RANK_DICT); DICT-BINS table, comprises of retrieved variables: samples (SAMPLE_BINS) indexes (IND_BINS) and ranks (RANK_BINS); DICT.SAMPLE_DICT, BINS.SAMPLE_BINS-variables SAMPLE retrieved from the corresponding tables.

This operation performs the grouping operation by the BINS samples, one by one, calculating the distances between every BINS and all the dictionary samples, and finding the least distance for every pair of the selected sample of the BINS and all dictionary samples. Output table DISTANCE is created by this operation with the samples of the BINS, least distances, and the corresponding samples of the dictionary and indexes of the dictionary and the BINS. The advantage of this operation is that it is compact and can be quickly used without extensive debugging and programming efforts by those skilled in the art.

This operation can require a considerable amount of memory to keep different combinations of calculated intermediate data, and as a result it could be more suitable for powerful computers with multi-processors and parallel computing means. For personal computers, used in a regular business practice, or micro processing means, the current invention uses in the preferred mode an accelerated operation of approximation of the random input by the random dictionary that is described in detail bellow.

Accelerated Approximation

Referring to the drawing, FIG. 6 describes in detail the best mode of the preferred operation 216 to find the least distances, that is very fast and utilizes small amount of temporary memory for execution. The principle of this operation, is to sort both the tables: the BINS and the dictionary sequences, and to use a guided search for small portions of the sequences, instead of an unguided exhaustive search for the large sequences. This operation performs the cycle of the search with the conditions for starting and stopping a current cycle adapted to the results of both the previous and the current search cycles. After both sequences (of the dictionary and the BINS) are sorted, the arrays of indexes of these sequences which keep the positions of the samples before sorting are saved. As a result, any sample can be identified by its position in the original sequence, and this operation of sorting is reversible.

For every current sample of the BINS, the search cycle is started with the best sample of the sorted dictionary, which produced the least distance in a previous search cycle. Because both these sequences (the dictionary and the BINS) are sorted, the dictionary samples, located before this best one, could produce only greater distances and they are therefore useless for this search cycle. Further, every consequent distance for the current BINS sample is compared with a distance, produced by the previous dictionary sample for the same BINS sample. If the current distance is bigger, the search cycle can be stopped, because with the sorted sequences the next distance could be only even bigger. A search cycle with the described adaptation is more effective than an exhaustive search, drastically reducing the number of operations.

As the new search cycle is started, the next sample from the BINS is not smaller than the previous one (again, because this sequence is sorted). The samples of the dictionary do not need to be retrieved in the current search cycle if they are positioned before the dictionary sample used to start the previous search cycle, because the distance can only be bigger.

The detailed description of the operation step by step according to FIG. 6 provided below. Operation of sorting used for both BINS and dictionary sequences before the search cycle started. This operation of sorting is very fast, and well designed sorting programs are available in many off-the-shelf products, as MathCAD, offered by MathSoft Co; Microsoft Access 2000 Data Base, offered by Microsoft Co.; SAS, offered by SAS Institute. The different methods of sorting are provided in Sedgewick R. D. (1989), Algorithms, Second Edition, Addison-Wesley Publishing Company, Reading, Mass., which is hereby incorporated herein by reference in its entirety.

Step 600 sorts the dictionary sequence by an amplitude D, and step 602 creates an array of these amplitudes to accelerate the operation. Step 604 creates an array of pre-sorted indexes of the dictionary. Step 606 sorts the BINS by the absolute amplitude. Step 610 creates an array of pre-sorted indexes for the sorted BINS. These arrays provide for acceleration of the search cycle. Arrays of pre-sorted indexes 604 and 610 (of the dictionary and the BINS) are used later to restore the dictionary and the BINS to the original form before sorting, after the search cycle is finished. The search cycle comprises two loops: an outer loop—to select an appropriate sample of the BINS and an inner loop—to select a sample of the dictionary that produced the least distance from the sample of the BINS. Step 612 selects in the outer loop the current sample of the BINS, starting with the first one.

The process of adaptation of the search cycle is guided by two assigned memory cells: numerical START for the beginning of the search cycle, and logical STOP—for the end of the search cycle. The variable START has a value of a number of a dictionary sample for the inner loop. Step 614 initializes the variable STOP=0. If this variable is assigned value STOP=1, this condition stops the search cycle before the end of the array of the dictionary is reached, as it is described below.

The state of the search cycle for a current sample of the BINS is identified by an index of this cycle Isearch. An index of the search cycle for a previous sample of the BINS is identified as Isearch−1. Step 618 starts the search cycle from the value of the index of the search cycle Isearch that is equal to the variable START, and stops if either of these two conditions is satisfied: the end of the dictionary is reached, or variable STOP=1. Step 620 checks a logical condition: is it the first sample of the BINS in the outer loop 612? If the answer is 'No', step 621 assigns the value of the variable START equal to the index of the search cycle before this search cycle stopped for the previous sample of the BINS: START=Isearch−1. If the answer is 'Yes', step 622 assigns the value START=1. Step 624 retrieves the current sample Dcur of the dictionary array 602 and the search cycle is ready for an execution.

Step 626 calculates the current distance DIST1 as an absolute difference between the current sample Dcur from step 624 of the dictionary array and the current sample W from step 612 of the BINS as $$DIST1=abs(W-Dcur).$$

Step 630 retrieves a previous sample Dprev of the dictionary array 602 in the current search cycle. Step 632 calculates the previous distance DIST2 from steps 612,630 as an absolute difference between the sample Dprev and the current sample of the BINS array as $$DIST2=abs(W-Dprev).$$

Step 633 checks a logical condition: is the current dictionary sample Dcur equal to or greater than the current sample W of the BINS? If this condition is true, this search cycle is stopped, because a next dictionary sample will produce even greater distance to the current sample of the BINS. The next question to be answered now is which distance is smaller—the distance from the current dictionary sample (Dcur), or the distance from the previous one (Dprev)? To find this answer, step 634 checks a logical condition: is the current distance bigger than the previous one: DIST1>DIST2? If the answer is 'YES'—then GOTO step 636, if 'NOT'—then GOTO step 654. Step 636 assigns the minimum distance to output DIST as DIST=DIST2. Step 638 assigns the index IND in the array created by step 604 of the corresponding dictionary sample Dprev as an output dictionary index that produced the least distance.

Step 640 assigns the sign of distance as '1' if W>Dcur. Step 642 assigns a variable START to the previous value of the index of the current search cycle: START=I prev, that is preparation for the next search cycle. Step 644 assigns variable STOP equal 1, because the least distance for the current dictionary sample found and the next search cycle prepared, and the cycle is stopped. Step 646 checks a condition: is it an end of the BINS? —to change the logic of the search cycle: if the answer is 'YES'—GOTO 658 for the output, if 'NO'—GOTO step 650 to continue this operation with the new search cycle. Step 650 retrieves the next sample from the BINS. Step 652 starts the new search cycle with the command GOTO step 614. Step 654 increments the index of the search cycle. Step 656 continues the search cycle with command GOTO 620. Step 658 creates output array of distances for all samples of the BINS. Step 660 creates output array of indexes for all samples of the BINS.

Step 662 creates output array of signs of the distances for all BINS samples. Step 664 performs the end of the search with the assignment STOP=1.

This operation, described in FIG. 6, is presented below in SAS programming language with comments.

```
%let &lenran=10000; /* define a length of a dictionary sequence */
            data DISTANCE; /* create the new data set with results of lookup */
retain START 1; /* assign the initial value of a memory cell to START variable */
    /* declare arrays of amplitudes and indexes of the dictionary */
array ardict_amp(&lenran)_temporary_;
array ardict_ind(&lenran)_temporary_;
    /* load a data set with a dictionary sequence in a memory */
if_n_=1 then do i=1 to &lenran until (end);
    set qm.dict end=end;
/* create arrays of amplitudes and indexes of the dictionary */
        ardict_amp(i)=DICT_SAMPLE;
        ardict_ind(i)=ind2;
                                end;
        FIN=&lenran;
        START=1;
    set qm.BINS; /* load the BINS */
/* start the search cycle for every consequent BINS sample */
do i=START to FIN until (STOP=1);
    ind2=ardict_ind(i);
    DCUR=ardict_amp(i);
    /* find the distance for a current dictionary sample */
    DIST1=abs(BINS-DCUR);
    START=1;
    /* assign variable START to the previous index of the search cycle for the next
        search cycle */
            if i>1 then START=i-1;
            if DCUR>=BINS then do; /* if a current dictionary sample becomes to be
            greater then a current BINS sample, the search cycle can be stopped */
    /* find distance between the current BINS sample and a previous dictionary sample */
    if i>1 then DPREV=ardict_amp(i-1);
    else DPREV=ardict_amp(i);
    DIST2=abs(BINS-DPREV);
    /* find what distance is greater-a current or a previous one */
    DIST=min(DIST1,DIST2);
    if DIST=DIST1 then do;
    /* find the index of the dictionary, related to the least distance; */
            w2=DCUR;
            ind2=ardict_ind(i);
            STOP=1;
            DIST1=DIST; /* assign DIST to least distance */
            output;
                    end;
            if DIST=DIST2 then do;
            w2=DPREV;
    if i>1 then ind2=ardict_ind(i-1); else
    ind2=1;
    STOP=1;
    DIST1=DIST;
    output;
                    end;
                end;
/* the last sample of the dictionary the current sample of the dictionary is defined as the
    best, if it lesser than the current BINS sample; the index of of the best sample of the
    dictionary selected as a current, not as a previous one */
    if DCUR<BINS and i=FIN then do;
            w2=DCUR;
            DIST=abs(BINS-w2);
            ind2=i;
            START=i;
            STOP=1;
            DIST1=DIST;
    output;
                    end;
    end;
    /* keep in the output: ind1 as an original position of a BINS sample BINS before
        sorting, ind2-the same for a dictionary sample DICT; rankBINS - ranks of the
        samples of the BINS from step 302, not used in the operation FIG. 6, but used
        later */
```

```
keep ind1 ind2 BINS DIST1 rankBINS;
run; /* the end of the program */
```

For testing, the described operation was modeled with SAS language release 8.01 and was used to find the least distances between two sequences (the BINS and the dictionary) with 10,000 samples and peak amplitudes of 2,000. This operation used the personal computer IBM X86 based PC, OS Windows 2000 Professional, processor X86 Family 6 TM Model B, Genuine Intel 930, total physical memory 129 Megabyte, available virtual memory 222 Megabyte, local fixed disk of 27 Gigabytes. The accelerated operation described above showed the drastically improved performance: many hundred times faster than SQL operation with the same computer, while losses of time for sorting are negligible.

Layout of the Output File and the Protocol

Referring to the drawing, FIG. 7 is a block diagram of a preferred operation given in detail to generate the output sequence from step 218. Field 700 describes the consecutive number of the BINS BINS_I. Field 702 describes the sequences of the distances DIST1–DISTN for every BINS_I. Field 704 describes the indexes IND_D1–IND_DN of the dictionary sequence for every consequent BINS_I, field 706 describes the sequence of sings of the distances for every sequence of distances SIGN_DIST1–SIGN_DISTN, field 708 outputs signs of the differences after centering the BINS_I, for all consequent BINS numbers SIGN_DIF1–SIGN_DIFN, field 710 describes the sequence of the ranks RANK1–RANKN for all BINS_I.

Referring to the drawing, FIG. 8 is a block diagram of a preferred operation in detail to generate the protocol 222. The protocol accumulated two types of parameters: predetermined, related to the process of assigning of initial values to the parameters, and calculated, related to the process of calculation. These parameters comprise the length of the BINS 820 (created by step 208) LW; the peak amplitude Apeak of the BINS 822 (created by step 208); the number of levels for the ranks Nrank 824, (assigned by step 300); the length of the dictionary Lrng 826, (assigned by step 500); the seed S of the RNG 828 (assigned by step 500), the current rank r 830; the maximum of the BINS MAXr 832 for the rank r; the minimum of the BINS MINr 834 for the rank r; the number of samples of the dictionary sequence Nr 836 for the rank r. Fields 832, 834, 836 accumulated by step 422 FIG. 4. The number of the iterations for output/input substitutions Nnreq accumulated in the field 838 (assigned by step 218).

Consequent Refinement With Multidictionary Compression

Both the BINS and the dictionary sequences are random and even the least distances could be too big for some particular samples of the BINS, so the rate of compression will deteriorate. An alternative dictionary could produce better results for some different groups of samples, but even worse results—for others. Referring to the drawing, FIG. 9 is a block diagram of a preferred operation in detail to solve this problem for a further improvement—to provide a consequent refinement with a multidictionary procedure for data compression.

After the first dictionary is used to produce the sequence of the least distances, a operation of selection retrieves the samples of the BINS with distances that are larger than a predetermined level. The next dictionary is adapted to the frequency distribution of the selected samples, and a new sequence of least distances generated. A comparison mean selects the samples with the smaller least distances from these two sequences produced by the dictionaries for the corresponding BINS samples. The new output sequence is generated with the selected least distances and the indexes of samples of a selected dictionary that produced the corresponding selected distances.

The output sequence contains a marker to identify what particular dictionary was used for the selected sample. This marker is predetermined to be unique for every dictionary. The present implementation counts indexes of every dictionary with a different base—to assign the different range of the indexes for every dictionary. The base of the indexes of a particular dictionary is used as a marker to identify these dictionaries. The process of the consequent refinement can be repeated with many dictionaries. For the current implementation It is recommended that two dictionaries be used.

Figure 9:
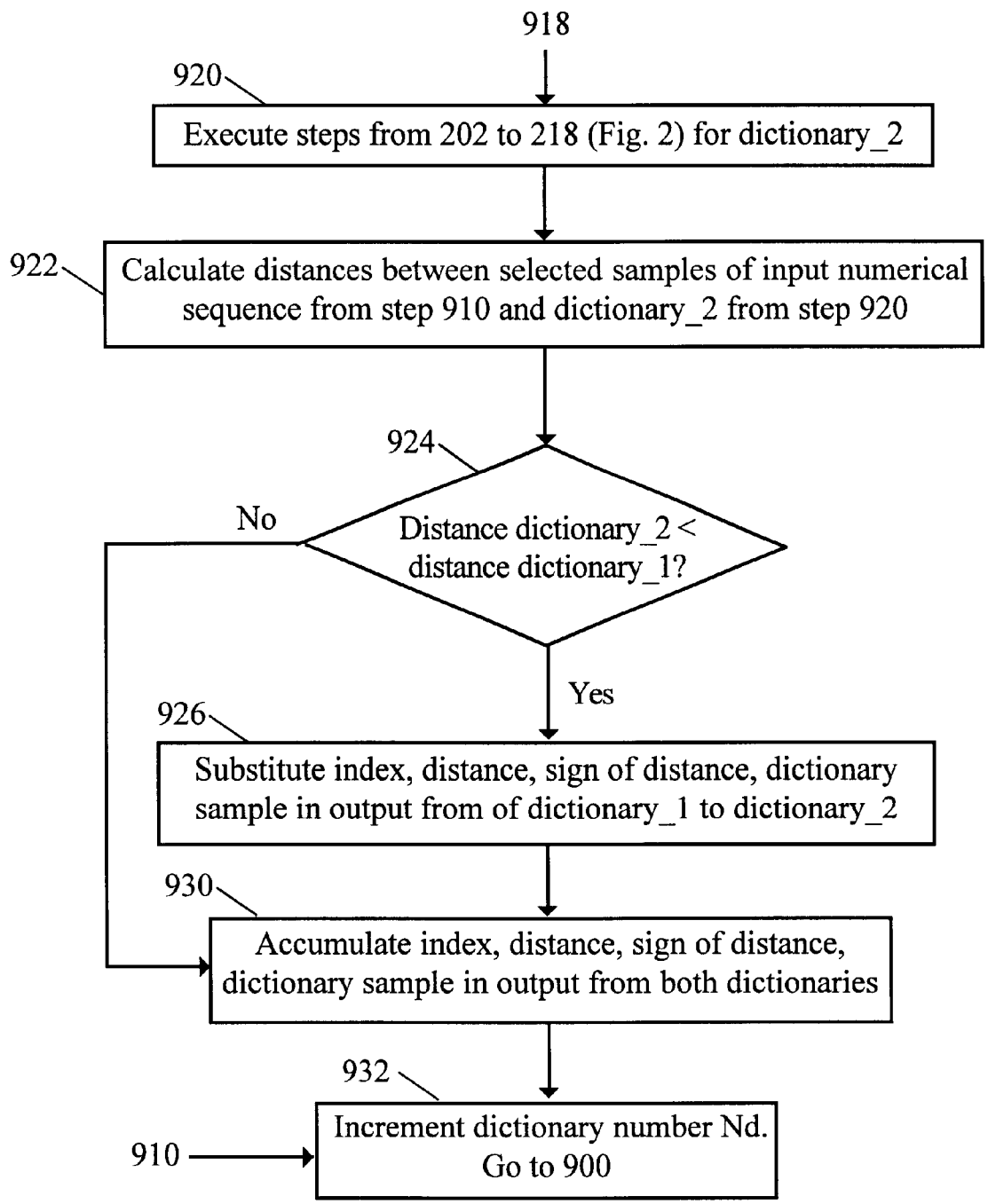
FIG. 9 depicts one embodiment of the consequent refinement of the process of compression with more than one compression dictionaries, in accordance with the principles of the present invention.

Referring to FIG. 9, this operation describes further the process of the consequent refinement with two dictionaries. Step 900 assigns the dictionary number Nd starting with the first one. Step 902 assigns a length for every dictionary Nd; it is preferably to select a length for the first dictionary an about 0.9 from the length of the dictionary in one-dictionary operation (step 500). For multi-dictionary operation it is recommended to select every consequent dictionary with a length an about 0.1–0.2 from the length of the dictionary with one-dictionary operation. Step 904 assigns the seed for the first dictionary S1=0, and for a consequent dictionary number Nd, the seed Sd could be any random number; the purpose of the optional new seed is to avoid possible correlation between dictionaries. Step 906 executes steps from 202 to 218 from FIG. 2 for dictionary_1. As a result, the next sequences produced: of the least distances, indexes of the first dictionary, and the samples of the first dictionary, corresponding to the least distances.

Step 908 assigns the limits Lup and Llow for the upper and bottom levels, to select the distances, satisfied by these conditions after the first dictionary executed. Step 910 is a selection mean to check the logical condition: Lup>Distance>Llow ?—to select the samples with the big enough distances produced by the first dictionary. The percentage of distances with large outliers usually is small, and the remaining samples will not substantially spoil a statistical compression applied later. At the same time, the range of selected distances should not be too broad, to achieve the best result with the short next dictionary. It is recommended that the distances be selected between an about 0.6 (Llow) and 0.9 (Lup) from the maximum distance produced by the first dictionary.

Step 912 fills an array of the samples of the BINS corresponding to the distances selected by step 910. Step 914 creates an array of indexes of the BINS samples corresponding to these selected distances (with the condition 'YES'). Step 916 retrieves the length of dictionary_2 (from step 902). Step 918 assigns the base of the index for the dictionary_2. This parameter is related to the length of dictionary_1. For example, if the length of dictionary_1 in step 902 is 9,000, then the base in step 918 can be selected as 9,001. As a result, the indexes in the outputted sequence 218 are identified in a unique way—the number of the dictionary that produced any particular sample. Step 920 generates the dictionary_2 from steps 212 and 214 and executes steps from 202 to 218 FIG. 2, with indexes starting from the selected base by assigning the beginning of the cycle in step 508. This second dictionary statistically adapted to the frequency distribution of the selected samples of the BINS, just as the first dictionary was adapted to the whole BINS.

Step 922 executes steps from 202 to 218 from FIG. 2 to find the distances between the BINS samples selected by step 910 and dictionary_2. Step 924 is a comparison mean to check the logical condition: is the distance from dictionary_1 (after step 906) greater than the distance from dictionary_2 (after step 922)? The samples with the smaller of the least distances from these two dictionaries will be selected in this step for the corresponding samples of the BINS. Step 926 substitutes the distance, the sign of the distance, the index of the dictionary sample in the output sequence with these parameters corresponding with the dictionary samples, that produced the smaller distance.

Step 930 accumulates the sequences of distances, the signs of these distances, ranks, and the indexes from both dictionaries. The ranges of indexes for the different dictionaries are different (because the base is different); as a result, the dictionary that produced a particular distance can be identified in the process of decompression later. The process of the consequent refinement can be repeated with multiple dictionaries by step 932. Extensive modeling showed that an operation with two dictionaries reduced an average of residuals up to ten times.

Layout of the Protocol for Mutidictionary Compression

Figure 10:
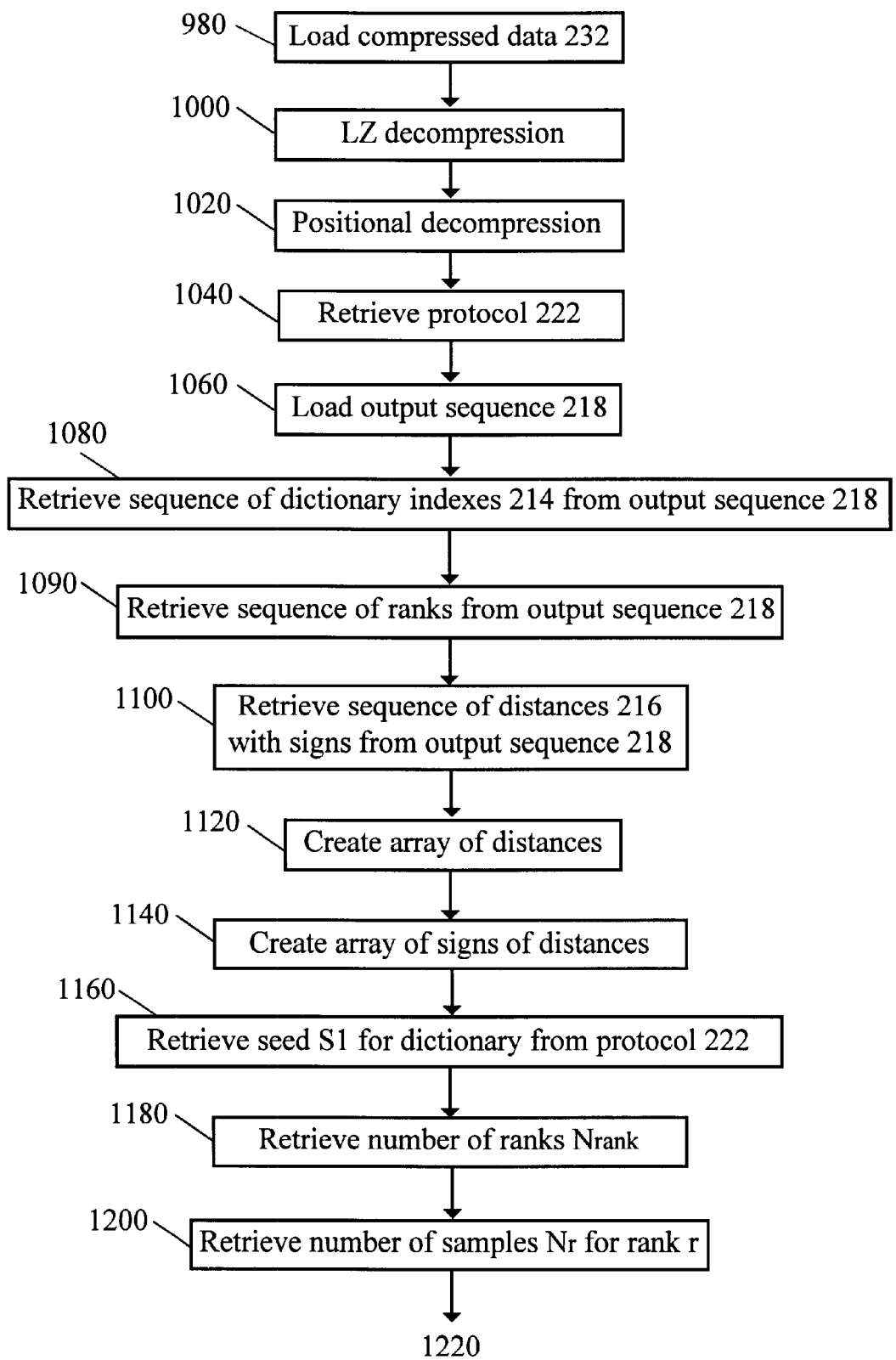
FIG. 10 depicts one embodiment of the protocol describing the process of lossless compression using multiple compression dictionaries, in accordance with the principles of the present invention.

Referring to the drawing, FIG. 10 is a block diagram of a preferred operation in detail to generate the protocol 222 for a multi-dictionary operation, comprising: the length of the BINS 206, the peak amplitude of the BINS Apeak 208, the number of levels for rank Nrank 300, the number of dictionaries NUM_DICT 302, the current dictionary number Nd 842, the limits Lup, Llow to select distances for the current dictionary number Nd 844, the length of the current dictionary number LD_N 846, the base of the index of the current dictionary number 848, the seed for the current dictionary number 850, the current rank r for the BINS in the operation for the current dictionary 852, the average Ar for the BINS 854, the number of the samples Nr 856 in the BINS, the maximum and the minimum MAXr, MINr 858. The fields with an index 'r' are related to a rank r. This information is complete to generate any consequent decompression dictionary that is exactly the same, as was generated during a compression operation.

Decompression With One Dictionary

Figure 11:
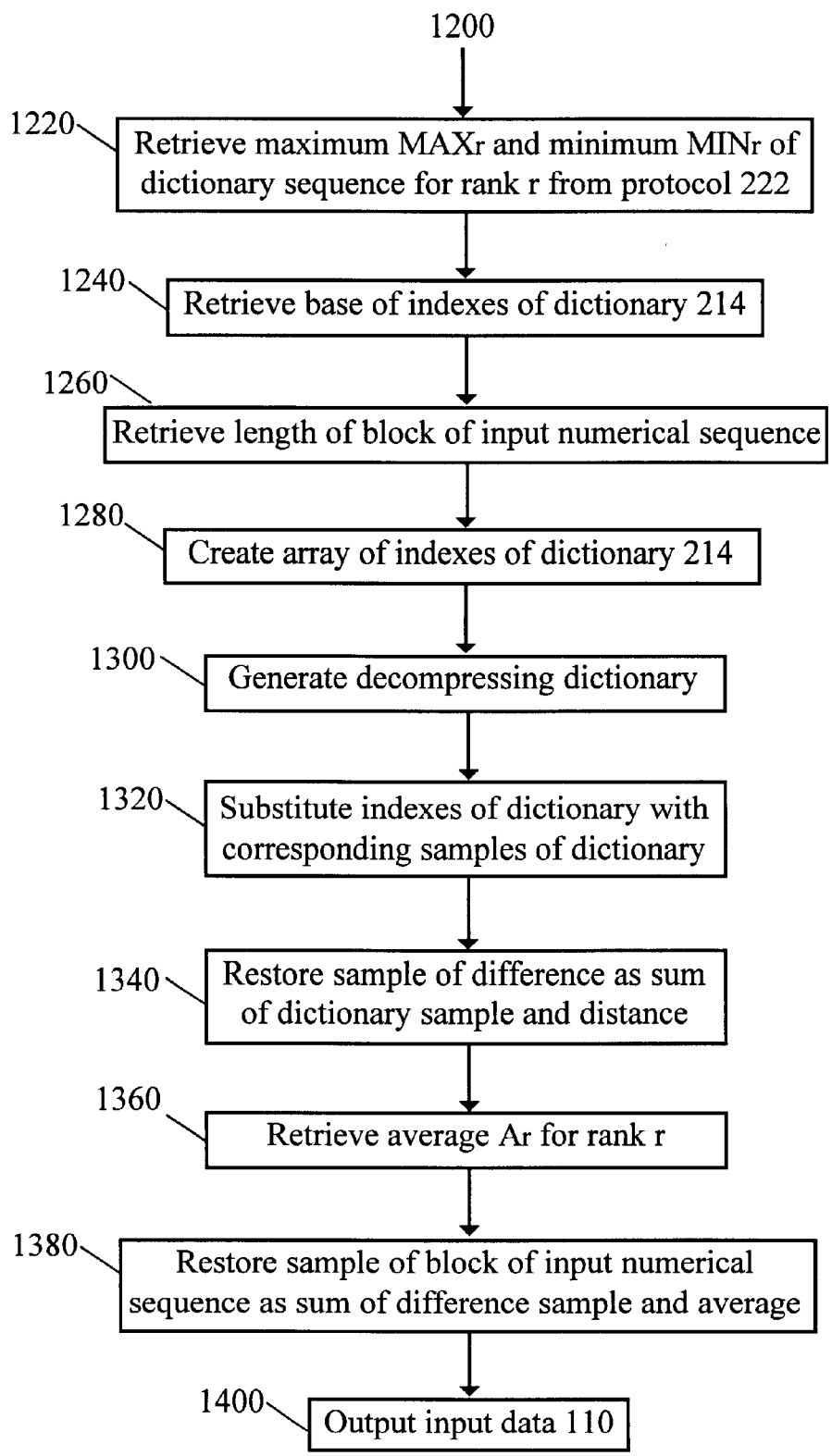
FIG. 11 depicts one embodiment of the operation of decompression with one dictionary, in accordance with the principles of the present invention.

Referring to the drawing, FIG. 11 is a block diagram of a preferred operation in detail to decompress the data compressed with one dictionary. All operations of compression described above are reversible, and as a result the process of decompression is lossless. The principle of this operation is to decompress the statistically compressed sequence, to retrieve from it all components: indexes, distances, signs, parameters describe a frequency distribution of the dictionary generated by the RNG. After that a decompression dictionary is generated that is the same as the compression dictionary, and indexes of the dictionary are substituted with the samples to perform reversed operation of decompression. Step 980 loads in the memory mean the compressed data 232. Step 1000 performs LZ decompression of the data. This operation is described in detail in Storer J. A. Data Compression: Method and Theory, Computer Science Press (1993), which is hereby incorporated herein by reference in its entirety. Operation of LZ decompression included in the aforementioned commercially available products implementing LZ compression.

Step 1020 performs positional decompression and restores output sequence 218. It is the shifting operation, but in the opposite direction to that was used for compression. For example, if a compressed sequence is 08 00 11 (radix 10), then the decompressed sequence is 01000 00000 01011. Step 1040 retrieves from the decompressed sequence and loads in the memory mean protocol 222, and the consequent steps retrieve from the protocol the necessary data to generate the decompression dictionary.

Step 1060 loads the output sequence 218 in the addressable memory area. Step 1080 retrieves the sequence of dictionary indexes 214 from the output sequence 218. Step 1090 retrieves the sequence of ranks of the dictionary sequence created by step 304 FIG. 3, from the output sequence 218. Step 1100 retrieves the sequence of the distances 216 with the signs from output sequence 218. Step 1120 creates the array of distances 216 to accelerate the operation of decompression. Step 1140 creates the array of signs of the distances.

Step 1160 retrieves the seed S1 of the RNG from the protocol 222. Step 1180 retrieves the number of ranks Nrank (assigned by step 300). Step 1200 retrieves the number of samples Nr for the rank r (calculated by step 406, FIG. 4). Step 1220 retrieves the maximum MAXr and the minimum MINr for the rank r (calculated by step 404 FIG. 4). Step 1240 retrieves the base of the indexes of the dictionary. The number of the dictionaries in this operation is one, so the base could be predetermined in the operation of compression. Step 1260 retrieves the length of the BINS. Step 1280 creates an array of the indexes 214 of the dictionary. Step 1300 generates the decompression dictionary, as described by steps 506–512, FIG. 5. The RNG will be executed for every rank the number of times equal to the number of samples Nr with the amplitude between MAXr and MINr.

Step 1320 substitutes the indexes of the dictionary from the output sequence with the samples of the dictionary corresponding to these indexes. Step 1340 restores a sample as a sum of the distance and the corresponding dictionary sample. Step 1360 retrieves from the protocol 222 the average Ar for the rank r, which was calculated by step 308 FIG. 3, and assigns the average Ar to every sample from step 1340 according to the rank from step 1090. Step 1380 restores an original sample of the BINS as the sum of a sample from step 1340 and an average Ar from step 1360. Step 1400 outputs the input data, as the sequence of the restored input samples.

Decompresssion With Multiple Dictionaries

Figure 12:
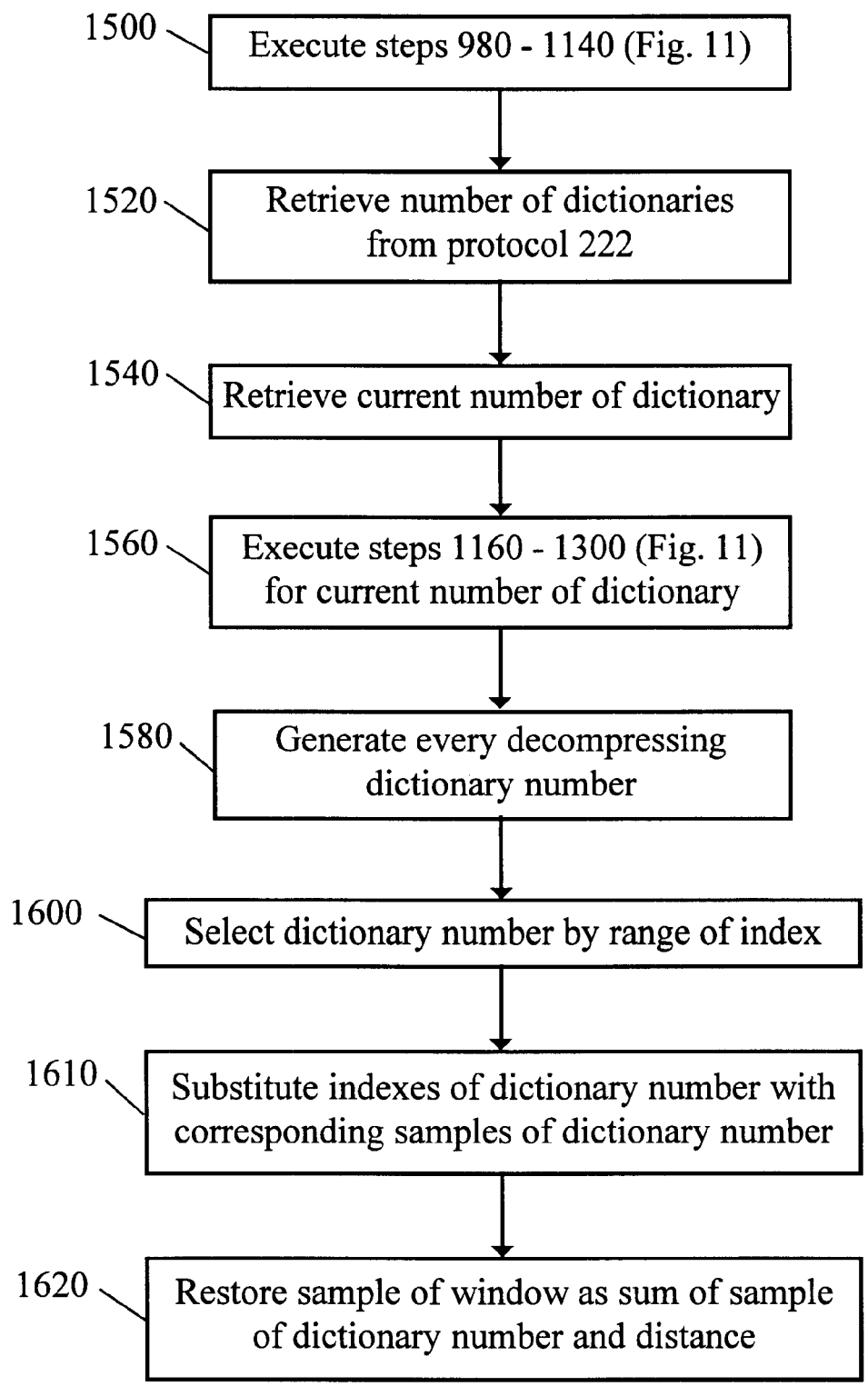
FIG. 12 depicts one embodiment of the operation of decompression using multiple dictionaries, in accordance with the principles of the present invention.

Referring to the drawing, FIG. 12 is a block diagram of a preferred operation in detail to decompress the data compressed with multiple dictionaries. This operation is performed in the same way as an operation of decompression for one dictionary, but indexes in the sequence of 218 are used to identify a particular dictionary used for compression. Parameters to generate all decompression dictionaries are retrieved from the protocol.

Step 1500 executes steps from 980 to 1140 ( FIG. 11). Step 1520 retrieves the number of the dictionaries used in the operation of compression from protocol 222. Step 1540 retrieves the current number of the dictionary. Step 1560 generates the current decompression dictionary and executes steps 1160–1300 ( FIG. 11) to retrieve the base for the indexes and all parameters of the statistical description of the current dictionary (the number of samples, the maximum, the minimum by the rank). Step 1580 generates every decompression dictionary for the number of dictionaries from step 1520. The base for the indexes defines the range of the indexes.

Step 1600 selects the dictionary number—it scans through the array of dictionary indexes retrieved by step 1080 and selects the dictionary by the range of the indexes of the dictionary. Step 1610 substitutes the indexes of the dictionary in the output sequence with the corresponding samples of the dictionary, as in step 1320, but the samples of the dictionary are retrieved from the corresponding dictionary. Step 1620 executes the operations in steps from 1340 to 1400 to restore the sequence of the input samples. Any operation for a particular dictionary is similar to the corresponding operation in one-dictionary operation of compression-decompression.

Example

The simple example below demonstrates the major principles of the present invention. A dictionary sequence is absolutely unrelated to an input sequence, and used only as a source of random numbers. Both sequences, the input and the dictionary are represented by the corresponding ASCII numerical or text codes.
One Dictionary Operation.

Input sequence 'big brown dog': 98 105 103 32 98 114 111 119 110 32 100 111 103.

Indexes of input: 1 2 3 4 5 6 7 8 9 10 11 12 13.

Dictionary sequence: 'quick red fox': 113 117 105 99 107 32 114 101 100 32 102 111 120.

Indexes of dictionary: 1 2 3 4 5 6 7 8 9 10 11 12 13.

The operation of approximate matching in the present invention finds for every sample of the BINS a sample of the dictionary that produced a smallest distance between these two samples. This procedure is designed to be fast and effective with sorting of dictionary and input sequences, as was described in detail above. The array of original indexes of both sequences is saved in the memory. As a result, any original sequence can be restored as it was before sorting.

Sorted input sequence: 32 32 98 98 100 103 103 105 110 111 111 114 119.

Pre-sorted indexes of the sorted input sequence: 4 10 1 5 11 3 13 2 9 7 12 6 8.

Sorted dictionary sequence (not-unique samples removed): 32 99 100 101 102 105 107 111 113 114 117 120.

Pre-sorted indexes of the sorted dictionary sequence: 6 4 9 8 11 3 5 12 1 7 2 13.

Dictionary samples closest to the input samples: 32 32 99 99 100 102 102 105 111 111 111 114 120.

Sequence of the least distances: 0 0 1 1 0 1 1 0 1 0 0 0 1.

Signs of distances: ++--++++-+++-.

Indexes of the used samples of the dictionary: 6 6 4 4 9 11 11 3 12 12 12 7 13.

The last three sequences comprise the output sequence. For a positional compression, the sequences of distances and signs can be concatenated and separated by blocks of about four bits, padding an incomplete block with zeros, and assigning the code '1' to the sign "+": 00 13 10 03 09 14 14. The sequence of indexes can be compressed in the same way with an appropriate radix selected.
The Search Cycle.

The cycle for the first sample of input (32) starts with the first sample of the dictionary (32). The distance is zero, flag STOP=1, the cycle for this sample stopped, and the cycle for the next input sample (32) started. All conditions are the same for this sample as for the previous one. The next input sample (98) is started with dictionary sample=32, which produces the distance=66; the next dictionary sample in this cycle is 99 with the distance=1, and the next is 100 with distance=2. The distance starts to grow, any consequent distance, starting from the sample 100, is greater than the previous one, and flag STOP=1. The cycle is stopped, the best sample of the dictionary (99) is selected with the distance=1. The pointer 'begin cycle' START moves to the best dictionary sample (99), because for the sorted sequence, the next input sample will be greater than the sample in the current cycle, and the samples before the best one will produce even greater distances.

Every search cycle for any consequent input sample will be started with a dictionary sample which produced the least distance in the previous cycle, and will be stopped after a few iterations. As a result, the speed of this operation is drastically increased, compared with an exhaustive search.
The Statistical Description The total volume of information for input BINS is 7*13=91 bits. The volume of information for output: distances=1*13=13 bits, indexes=4*13=52 bits, signs for distances=1*13=13 bits. The number of bits for output decreased: 1+4+1=6. The volume of information for output sequence is 6*13=78, and for this metrics it is demonstrated that the volume of information here reduced, though to achieve it is not the only necessary objective of the current invention.

For different sequences of the input and the dictionary results could be better or worse, but even if this first step does not produce an effect of compression, the statistical properties of the output sequence are very different from the input BINS. The sequence of distances in this example contains 62% or more zeros; all samples are small and contain many repetitions. Even the first step of the procedure of compression created favorable conditions the use of the published statistical coding or dictionary techniques.
Decompression:

Distances: 0 0 -1 -1 0 1 0 0 -1 0 0 0 -1.

Indexes of the dictionary: 6 6 4 4 9 11 11 3 12 12 12 7 13.

Sequence of the decompression dictionary: 113 117 105 99 107 32 114 101 100 32 102 111 120.

Indexes of the dictionary: 1 2 3 4 5 6 7 8 9 10 11 12 13.

Samples selected from the dictionary by the index: 32 32 99 99 100 102 102 105 111 111 111 114 120.

Restored input: 98 105 103 32 98 114 111 119 110 32 100 111 103.

losses: 0
Multi-dictionaries Operation.

Further improvement is achieved with consequent refinement; the present invention uses several dictionaries, so the total dictionary consists of concatenated subsequences, and above described approach applied for each of them to find the samples, that produced the least distances. For example, the second dictionary could be a sequence:

'tales of wonderland' with the numerical equivalent: 116 97 108 101 116 32 111 102 32 119 111 110 100 101 114 108 97 110 100.

The new composed dictionary ('||' is concatenation symbol): 'quick red fox'|| 'tales of wonderland'.

The ranges for indexes are from 1 to 13 and from 14 to 32 for the corresponding subsequences. After the least distances are found for the first dictionary, the selection operation finds the subsequence of the input samples which produced the largest residuals for the first subsequence of dictionary: 98 98 103 110 119

Samples of the second the dictionary: 97 97 102 110 119

Indexes of the second dictionary: 15 15 21 25 23

Distances for the second dictionary: 1 1 1 0 0.

The operation of selection in the preferred mode selects from these two sequences of residuals the smaller samples, and the input samples substituted with corresponding indexes of the dictionary.

Final sequence of distances: 0 0 −1 −1 0 1 0 0 0 0 0 0 0.

Final sequence of indexes: 0 6 6 4 4 9 11 11 3 25 12 12 7 23.

The number of zeros in the sequence of distances was increased after the second dictionary was applied. In the process of decompression, if an index is in a particular range assigned to a dictionary, a sample of dictionary to add it to a sample of residual for restoration is taken from the corresponding dictionary (in this example, the samples with indexes 23 and 25 were substituted with the samples from the second dictionary).

The Effect of Ranking

Let the number of ranks assigned be equal to six (Nrank=6). The maximum sample for the input sequence is 119, so the rank size is Rs=120/6=20. The sequence of the ranks for the above sequence is R=round (A/Rs): 5 5 5 1 5 6 6 6 6 1 5 6 5. The averages for samples with the rank 1 is A1=32; with rank 5 is A5=101; with rank 6: A6=113. The sequence of the absolute residuals (the sequence of the signs assigned to the sequence below): 3 4 2 0 3 1 2 6 3 1 2 2.

The maximum, the minimum, and the number of the samples for the rank r: MAX1=32 MIN1=32 N1=2; MAX5=105 MIN5=98 N5=6; MAX6=110 MIN6=119 N6=6.

The volume of information for the rank r: V1=2*1=2 V5=(105−98)*6=42 V6=(119−110)*5=45 Vtotal=2+42+45=89.

The percentage of the volume of information by the rank: DCUR=2/89=0.02 P5=42/89=0.47 P6=0.5.

Let the length of the dictionary be 6.

The dictionary should be generating with the maximum and minimum distributed by rank that are equal to the same parameters of the residuals and with the number of the samples ND distributed by rank r: ND1=ceil (0.02*6)=1 ND5=round (0.47*6)=2 ND6=round (0.5*6)=3.

The generated sequence of the random number should be like this: 98 105 110 114 119 32.

After approximate matching with the closest matched sample of the dictionary, the sequence of the least absolute distances is 9 (the sequence of the signs assigned to the samples bellow): 0 2 0 1 0 2 1 2.

The average of this sequence is 0.6, with many repetitions; 62% of samples are zeros. This example demonstrated the basic principle of the present invention, but many derivations can be pointed out:

a) the multiple dictionaries operation covers input samples better, than a single one, but if the total length of the dictionary sequences increase, the sequence of indexes will occupy more space in the final output sequence, and the process of compression could deteriorate;

b) the range of the numerical sequence of the dictionary should cover the range of the input sequence;

c) a frequency distribution of the dictionary should be similar to a frequency distribution of the input samples in the BINS to use the samples of the dictionary effectively for the sub ranges of the changes of the amplitude.

SUMMARY

While a preferred embodiment of the invention has been disclosed and described in detail herein, it will be obvious to those skilled in the art that various changes in form and detail may be made without departing from its spirit and scope.

What is claimed is:

1. A method of binary data compression of a sequence of data values for transmission or storage, using a dictionary sequence for compressing a stream of data, comprising:

a) generating an input numerical sequence comprising of samples of numerical equivalents, associated with the input binary sequence wherein said numerical equivalents have predetermined both a peak amplitude and a length;

b) generating dictionary sequences of numerical samples utilizing random number generators with predetermined both a peak amplitude and a length;

wherein said random number generators having a said peak amplitude an about similar as said peak amplitude of samples of said input numerical sequence;

wherein said random number generators having said length sufficient to cover approximately multiple amplitudes of said input numerical sequence;

c) generating a sequence of indexes having a value of positions of said numerical samples of said dictionary sequences in said dictionary sequences by utilizing an addressable memory area;

d) selecting a best dictionary sample having a shortest distance between said numerical sample of said dictionary sequences and said input numerical sample for said input numerical sequence;

e) generating a sequence of said indexes of said best dictionary samples;

f) generating a protocol with a sequence of both predetermined and calculated parameters of said input numerical and dictionary sequences, comprising: said lengths of both said input numerical and dictionary sequences, said peak amplitude of said input numerical sequence, the seeds of said random number generators;

g) generating output sequence comprising: said shortest distances, said indexes of corresponding dictionary samples, having said shortest distances, and said protocol;

thereby providing reversible transforming of the input random binary data with a small number of repetitions to said output sequence comprising a sequence having small amplitude and many repetitions;

h) performing compression for said output sequence;

i) selecting a method of said compression from a list comprising: Lempel-Ziv type dictionary compression, statistical coding, decorrelation, memory cells packing, according to one or more criteria, selected based on a particular application;

whereby providing lossless compression of a random said input binary sequence with a calculated random said dictionary sequence, approximately matching said input numerical sequence.

2. Method of claim 1 further comprising:
a) parsing said input binary sequence into a plurality of blocks, wherein each block has a predetermined length;
b) providing an addressable area of memory having ability to store said blocks;
c) loading said consequent block of said input binary sequence in said area of addressable memory;
  whereby providing an acceleration of said process of data compression.

3. The method of claim 1, wherein said at least one specified criterion comprises one or more of the following criteria:
a) maximizing a compression ratio of said losselessly compressed said input data;
b) minimizing a duration of an operation of said losselessly compression of said input data;
c) minimizing a time of an operation of transmission of said losselessly compressed said input data;
d) maximizing a level of protection of said input binary sequence from unauthorized reading;
  whereby providing adaptation of the process of compression and decompression to a particular application.

4. The method of claims 1 further comprising:
a) determining a frequency distribution for said input numerical sequence;
b) generating of said dictionary sequence, utilizing a scaling transformation, having said frequency distribution similar for both said dictionary and said input numerical sequences;
c) accumulating parameters of said frequency distribution for said dictionary in said protocol;
  whereby providing improvement of a coverage of a range of changes of said amplitude of said input numerical sequence by said numerical dictionary sequence;
  whereby providing a reproduction of said dictionary sequences for a decompression operation.

5. Method of claim 4, wherein said operation of calculating of said frequency distribution comprising steps of:
a) calculating said frequency distribution for said input numerical sequence for a group of said amplitudes with the same rank code variable;
b) generating said dictionary sequence utilizing said scaling transformation having said frequency distribution similar to said frequency distribution of said input numerical variable for every rank code variable;
  whereby providing improved approximation of said input numerical sequence by said dictionary sequence in sub ranges of changes of said amplitude of said input numerical sequence.

6. Method of claims 4 wherein said frequency distribution calculated comprising steps of:
a) determining said maximum and minimum, said number of said samples for said input numerical sequence for a group of said amplitudes with the same rank code variable;
b) determining a percentage of said number of samples of said input numerical sequence for said group with said ranking code from a total number of samples from said number of samples of said input numerical sequence;
c) determining a number of samples of said dictionary sequence for every group of said samples with the same ranking code through computing said number as a result of multiplying said percentage of said number of samples of said input numerical sequence by said length of said dictionary sequence;
d) generating said dictionary sequence utilizing a cycle, wherein a number of iterations in said cycle is about the same as said number of samples of said dictionary sequence for every group of said samples with the same ranking code;
e) generating said dictionary sequence in said cycle utilizing said scaling transformation wherein said maximum and said minimum similar to said maximum and said minimum of said input numerical variable for every rank code variable;
f) accumulating in said protocol said maximum, said minimum, and said number of samples for every group of said samples with the same ranking code for said dictionary sequence;
  whereby providing improved approximation of said input numerical sequence by said dictionary sequence in sub ranges of changes of said amplitude of said input numerical sequence.

7. The method of claim 1 wherein said step of determining said frequency distribution comprising:
a) determining a maximum and a minimum of said numerical input sequence;
b) generating said dictionary sequence utilizing a scaling transformation having said maximum and said minimum of said dictionary sequence similar to said maximum and said minimum of said numerical input sequence;
c) accumulating said maximum and said minimum in said protocol;
  whereby providing improvement of a coverage of a range of changes of said numerical sequence by said numerical dictionary sequence.

8. The method of claim 1 further comprising:
a) selecting a predetermined number of levels of a ranking code value;
b) assigning said ranking code value associated with the amplitude of said sample of said numerical input sequence;
c) calculating an average value for said samples of said numerical input sequence having the same said ranking code;
d) calculating a sequence of centered differences between said current samples of input numerical sequence and said average having the same ranking code;
  thereby providing reversible transformation of said input numerical sequence to a sequence with small amplitude and an increased number of repetitions;
e) selecting said sequence of the centered differences as an output to the operation described by step a) of claim 1;
f) accumulating in said protocol said number of levels of ranking code value, said average value and said corresponding ranking code;
g) performing operations described in steps b)–i) of claim 1;
  thereby improving the process of an approximation of the random input numerical sequence with a sad small amplitude with the random dictionary sequence of the predetermined length.

9. The method of claim 8 further comprising:
accumulating the centered differences in a number of successive cycles, with input of a current cycle being substituted with an output from a previous cycle, wherein said averages and said cycle number being accumulated in said protocol;

whereby providing a reversible transformation of said input numerical sequence to a sequence with small said peak amplitude and an increased number of repetitions of said samples of said numerical input sequence;

whereby providing improved approximation of said input numerical sequence with said dictionary sequence.

10. The method of claim 1, wherein step d) comprising:
a) sorting both said input numerical sequence and said dictionary sequences;
b) accumulating sequences of both pre-sorted indexes of said input numerical sequence and said dictionary sequences;
c) performing a search cycle of finding said least distance between a sample of said sorted input numerical sequence and said samples of said sorted dictionary sequence;
d) starting a search cycle of finding said least distance for the first sample of said sorted input numerical sequence with the first sample of said dictionary sequence;
e) finding current absolute distance between said sample of said sorted input numerical sequence and a current dictionary sample of said dictionary sequence in said search cycle;
f) finding a previous absolute distance between said sample of said sorted input numerical sequence and a previous dictionary sample of said dictionary sequence in said search cycle;
g) comparing said current and said previous distance;
h) assigning to a stopping variable value equal to one when said current distance is not smaller than said previous distance;
i) assigning said best dictionary sample to a sample of dictionary sequence when said stopping variable is equal to one;
j) determining an index of said best dictionary sample from said sequence of pre-sorted indexes of said dictionary sequence for a corresponding said dictionary sample;
k) finishing said search cycle when said stopping variable is equal to one;
l) accumulating said best dictionary sample, corresponding to said smallest distance and said index of said best dictionary sample;
m) assigning to a stopping variable value equal to null when said search cycle started for the next said sample of input numerical sequence;
n) starting a search cycle of finding said least distance for the next said sample of said sorted input numerical sequence from said best dictionary sample of said dictionary sequence from the previous said search cycle;
o) repeating said steps until an end of said sorted input numerical sequence;
p) restoring pre-sorted input numerical sequence from said sequence of pre-sorted indexes of said input numerical sequence.

11. The method of claim 1 further comprising
a) assigning predetermined upper and lower levels for selection of said least distances;
b) retrieving a sequence of samples from said input numerical sequence corresponding to said least distances are in a range of said upper and bottom levels;
c) generating a sequence of indexes having a value of positions of said selected samples in said input numerical sequence;
d) substituting output of operation step a) of claim 1 with said sequence of said selected samples claim 11, step b);
e) assigning a unique base value and a range for said index of said consequent dictionary sequence;
f) repeating steps from b) through g) of claim 1;
g) assigning a dictionary number to of said consequent dictionary sequence;
h) accumulating a table of correspondence between said dictionary number said base value and said range for said index of said dictionary sequence in said protocol;
i) comparing said least distances produced by said consequent dictionaries for corresponding samples of said input numerical sequence;
j) selecting a smallest distance from a plurality of said least distances for corresponding samples of said input numerical sequence;

whereby providing a lossless consequent refinement of the results of an approximation of said input numerical sequence by said multiple random dictionaries.

12. The method of claim 11, further comprising:
a) repeating operations steps from a) through j) with a predetermined number of said repetitions;

whereby providing a lossless consequent refinement of the results of an approximation of said input numerical sequence by said multiple random dictionaries.

13. The method of claim 1, further comprising:
a) substituting said input numerical sequence with said sequence of said least distances and said indexes of the dictionary sequence;
b) repeating said operations steps from a) through i) with a predetermined number of said repetitions;

whereby providing the further process of the consequent refinement of the data compression by a number of iterations.

14. An apparatus for binary data compression of a sequence of data values for transmission or storage, using a dictionary sequence comprising:
a) computer readable program code means for causing a computer to create a sequence of numerical equivalents of said input data with a predetermined peak amplitude and a predetermined number of said numerical equivalents;
b) computer readable program code means for causing a computer to calculate a frequency distribution of said sequence of numerical equivalents of said input data;
c) computer readable program code means for causing a computer to generate a dictionary sequence utilizing a random number generator having said frequency distribution similar for said dictionary sequence and said sequence of numerical equivalents of said input data;
d) computer readable program code means for causing a computer to search for a least distance from a plurality of distances between every said numerical equivalent of said input data and said sequence of dictionary samples;
e) computer readable program code means for causing a computer to search for an index of a best dictionary sample, corresponding to every said least distance;

f) computer readable program code means for causing a computer outputting said sequence of least distances, sequence of said indexes of said best dictionary samples;
  thereby providing transforming the random binary data to the sequence, comprising the sequence of the small samples with many repetitions;
g) computer readable program code means for causing a computer outputting a protocol with a sequence of predetermined parameters and a sequence of results of calculations, comprising the length of said sequence of numerical equivalents of said input data, said peak amplitude, a parameters of said frequency distribution for the dictionary;
  thereby providing lossless decompression of said input data;
h) computer readable program code means for causing a computer performing compression for said substituted sequence and said protocol, selecting a method of said compression from a list, including: Lempel-Ziv type dictionary compression, statistical coding, decorrelation, memory cells packing, according to one or more criteria selected based on said particular application, for said substituted sequence and said protocol;
  whereby providing lossless compression of the random input binary sequence with said calculated random dictionary, approximately matched said input sequence.

\* \* \* \* \*